(12) United States Patent
Wade et al.

(10) Patent No.: US 10,630,393 B2
(45) Date of Patent: Apr. 21, 2020

(54) SPLIT PHOTODETECTOR FOR DIFFERENTIAL RECEIVERS

(71) Applicant: Ayar Labs, Inc., San Francisco, CA (US)

(72) Inventors: Mark Wade, Berkeley, CA (US); Chen Sun, Berkeley, CA (US); Nandish Mehta, Berkeley, CA (US)

(73) Assignee: Ayar Labs, Inc., Emeryville, CA (US)

( * ) Notice: Subject to any disclaimer, the term of this patent is extended or adjusted under 35 U.S.C. 154(b) by 10 days.

(21) Appl. No.: 15/687,413

(22) Filed: Aug. 25, 2017

(65) Prior Publication Data

US 2018/0062761 A1 Mar. 1, 2018

Related U.S. Application Data

(60) Provisional application No. 62/380,354, filed on Aug. 26, 2016, provisional application No. 62/385,916, filed on Sep. 9, 2016.

(51) Int. Cl.

| | | |
|---|---|---|
| *H04B 10/67* | (2013.01) | |
| *G02B 6/12* | (2006.01) | |
| *H01L 27/144* | (2006.01) | |
| *H01L 31/02* | (2006.01) | |
| *H01L 31/0203* | (2014.01) | |
| *H01L 31/0232* | (2014.01) | |
| *H01L 31/024* | (2014.01) | |
| *H01L 31/028* | (2006.01) | |
| *H01L 31/0312* | (2006.01) | |
| *H01L 31/0368* | (2006.01) | |
| *H01L 31/103* | (2006.01) | |
| *H01L 31/18* | (2006.01) | |
| *G02B 6/293* | (2006.01) | |
| *G02B 6/42* | (2006.01) | |

(52) U.S. Cl.
CPC ......... *H04B 10/67* (2013.01); *G02B 6/12004* (2013.01); *G02B 6/29338* (2013.01); *H01L 27/1443* (2013.01); *H01L 31/0203* (2013.01); *H01L 31/024* (2013.01); *H01L 31/02005* (2013.01); *H01L 31/028* (2013.01); *H01L 31/02019* (2013.01); *H01L 31/02325* (2013.01); *H01L 31/0312* (2013.01); *H01L 31/03682* (2013.01); *H01L 31/103* (2013.01); *H01L 31/1804* (2013.01); *G02B 6/4289* (2013.01); *G02B 2006/12061* (2013.01); *G02B 2006/12078* (2013.01); *G02B 2006/12123* (2013.01)

(58) Field of Classification Search
CPC .................................. G02B 6/12004
See application file for complete search history.

(56) References Cited

U.S. PATENT DOCUMENTS

2016/0124251 A1* 5/2016 Zhang .................. G02B 6/1225
 385/8
2017/0315421 A1* 11/2017 Popovic .................... G02F 1/29

* cited by examiner

*Primary Examiner* — Sung H Pak
*Assistant Examiner* — Hoang Q Tran
(74) *Attorney, Agent, or Firm* — Penilla IP, APC

(57) ABSTRACT

An optical cavity is formed to have a circuitous configuration. The optical cavity is configured to receive light coupled from a waveguide. At least two photodetector sections are formed over respective portions of the optical cavity. Each of the at least two photodetector sections is configured to detect light present within the optical cavity. Each of the at least two photodetector sections is configured for separate and independent control.

33 Claims, 15 Drawing Sheets

View A-A

View A-A

View B-B

View B-B

View A-A

View A-A

US 10,630,393 B2

SPLIT PHOTODETECTOR FOR DIFFERENTIAL RECEIVERS

CLAIM OF PRIORITY

This application claims priority under 35 U.S.C. 119(e) to U.S. Provisional Patent Application No. 62/380,354, filed Aug. 26, 2016, and to U.S. Provisional Patent Application No. 62/385,916, filed Sep. 9, 2016. The disclosure of each above-identified Provisional Patent Application is incorporated herein by reference in its entirety for all purposes.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient mechanisms for detecting laser light at a given node. Also, it is desirable for the laser light detection mechanisms to have a minimal form factor and be designed as efficiently as possible. It is within this context that the present invention arises.

SUMMARY

In an example embodiment, a photodetector device is disclosed. The photodetector device includes an optical cavity having a circuitous configuration. The optical cavity is configured to receive light coupled from a waveguide. The photodetector device includes at least two photodetector sections formed over respective portions of the optical cavity. Each of the at least two photodetector sections is configured to detect light present within the optical cavity. Each of the at least two photodetector sections is configured for separate and independent control.

In an example embodiment, a method is disclosed for operating a photodetector device. The method includes coupling light from a waveguide into an optical cavity of the photodetector device, where the optical cavity has a circuitous configuration. The method also includes operating at least two photodetector sections formed over respective portions of the optical cavity to detect light present within the optical cavity. Each of the at least two photodetector sections is operated separate and independent from each other.

In an example embodiment, a method is disclosed for manufacturing a photodetector device. The method includes forming an optical cavity having a circuitous configuration. The optical cavity is configured to receive light coupled from a waveguide. The method also includes forming at least two photodetector sections over respective portions of the optical cavity. Each of the at least two photodetector sections is configured to detect light present within the optical cavity. Each of the at least two photodetector sections is configured for separate and independent control.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments are disclosed herein for a resonant photodetector device and receiver circuitry that can be configured to produce many output photocurrents to enable higher performance optical data communication receivers and improved photodetector functionality. The resonant photodetector device disclosed herein is designed and configured to detect light having one or more wavelengths. It should be understood that the term "wavelength" as used herein refers to the wavelength of electromagnetic radiation. And, the term "light" as used herein refers to electromagnetic radiation within a portion of the electromagnetic spectrum that is usable by optical data communication systems. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. It should be understood that light may be confined to propagate in an optical waveguide, such as (but not limited to) an optical fiber or an optical waveguide within a planar lightwave circuit (PLC). In some embodiments, the light can be polarized. And, in some embodiments, the light has a single wavelength, where the single wavelength can refer to either essentially one wavelength or can refer to a narrow band of wavelengths that can be identified and processed by an optical data communication system as if it were a single wavelength.

Figure 1A:
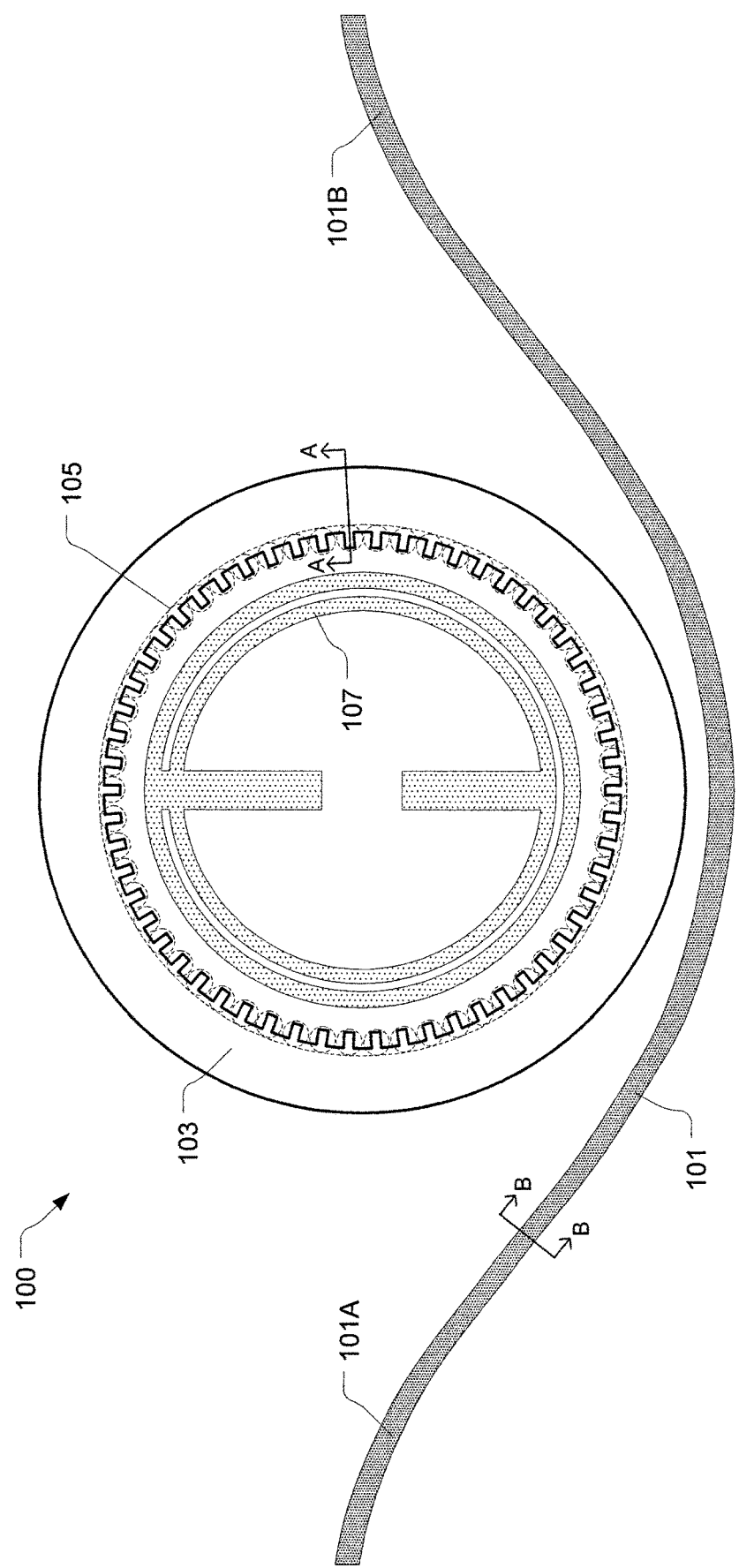
FIG. 1A shows a number of base features of a resonant photodetector device, in accordance with some embodiments of the present invention.

FIG. 1A shows a number of base features of a resonant photodetector device 100, in accordance with some embodiments of the present invention. The resonant photodetector device 100 includes a passive optical cavity 103. In some embodiments, the passive optical cavity 103 is configured to have a substantially annular shape, i.e., substantially ring-shaped. The passive optical cavity 103 includes a number protuberances 105 positioned along an inner surface/inner wall of the passive optical cavity 103. Each of the protuberances 105 are configured to provide for electrical connection to the resonant photodetector device 100. More specifically, the electrical characteristics of the protuberances 105 can be defined such that the protuberances 105 serve as electrical contacts to the passive optical cavity 103. In this manner, the protuberances 105 serving as electrical contacts provide for many independent electrical connections to the resonant photodetector device 100. It should be understood that the protuberances 105 provide for direct electrical, thermal, and/or mechanical contact to the passive optical cavity 103. In some embodiments, the electrical contacts to the resonant photodetector device 100 can be placed directly along the inner side walls of the passive optical cavity 103, thereby allowing formation of the passive optical cavity 103 without the protuberances 105. In various embodiments, the electrical characteristics of each protuberance 105 (or direct electrical contacts to the passive optical cavity 103) can be defined to allow the resonant photodetector device 100 to perform optical modulation, optical detection, opto-mechanical transduction, chemical and/or biological sensing, among other operations, by way of example. In various embodiments, the passive optical cavity 103 and protuberances 105 can be formed of crystalline silicon, polycrystalline silicon, amorphous silicon, silica, glass, silicon nitride (SiN, Si3N4), or III-V semiconductor material, among others, by way of example. In some embodiments, the passive optical cavity 103 with protuberances 105 can be formed by etching its structure from a layer of the material of which it is formed. However, it should be understood that in various embodiments the passive optical cavity 103 with protuberances 105 can be formed by essentially any suitable manufacturing technique or combination of techniques, of which etching is an example. Also, it should be understood that the passive optical cavity 103 with protuberances 105 is surrounded by a cladding material that has a lower refractive index relative to the passive optical cavity 103. In various embodiments, by way of example, the cladding material can be SiO2, Si3N4, air, or another material having a suitably lower refractive index relative to whatever material is used for the passive optical cavity 103.

In some embodiments, the passive optical cavity 103 is configured to have a substantially circular outer perimeter. In some embodiments, a radius of the substantially circular outer perimeter of the passive optical cavity 103 is within a range extending from about 2000 nanometers (nm) to about 50000 nm. In some embodiments, the radius of the substantially circular outer perimeter of the passive optical cavity 103 is about 5000 nm. It should be understood, however, that in some embodiments the radius of the substantially circular outer perimeter of the passive optical cavity 103 can be less than 2000 nm or greater than 50000 nm. Also, in some embodiments, the passive optical cavity 103 may have a non-circular outer perimeter. For example, in some embodiments, the passive optical cavity 103 can have an oval-shaped outer perimeter. Also, in some embodiments, the passive optical cavity 103 can have a circuitous outer perimeter that is non-symmetric about a centerline of the resonant photodetector device 100. Also, in some embodiments, the protuberances 105 have a width less than about 1000 nm, where the width is measured perpendicular to the radius of the substantially circular outer perimeter of the passive optical cavity 103. In some embodiments, the width of the protuberances 105 is within a range extending from about 10 nm to about 500 nm. Also, in some embodiments, closest surfaces of adjacent protuberances 105 are separated from each other by a straight-line distance of up to 1000 nm. And, in some embodiments, closest surfaces of adjacent protuberances 105 are separated from each other by a straight-line distance within a range extending from about 10 nm to about 500 nm.

Figure 1B:
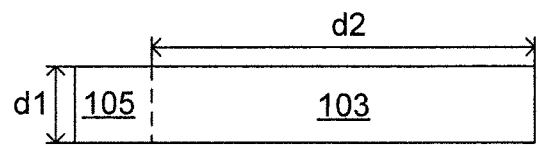
FIG. 1B shows a vertical cross-section view A-A of the passive optical cavity with protuberances, in accordance with some embodiments of the present invention.

FIG. 1B shows a vertical cross-section view A-A of the passive optical cavity 103 with protuberances 105, in accordance with some embodiments of the present invention. In the example configuration of FIG. 1B, the passive optical cavity 103 and the protuberances 105 have a substantially uniform vertical thickness d1. In some embodiments, the vertical thickness d1 is within a range extending from about 30 nm to about 300 nm. In some embodiments, the vertical thickness d1 is about 80 nm. It should be understood, however, that in other embodiments the vertical thickness d1 can be either less than 30 nm or greater than 300 nm. Also, in the example configuration of FIG. 1B, the passive optical cavity 103 (not including the protuberance 105) has a radial width d2. In some embodiments, the radial width d2 is within a range extending from about 500 nm to about 3000 nm. In some embodiments, the radial width d2 is about 1200 nm. It should be understood, however, that in other embodiments the radial width d2 can be either less than 500 nm or greater than 3000 nm.

Figure 1C:
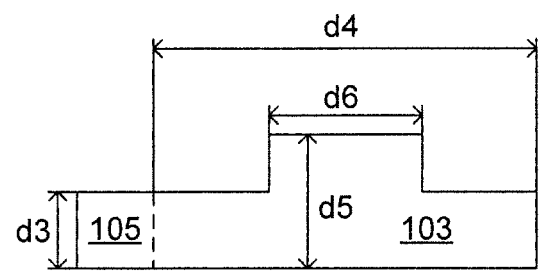
FIG. 1C shows another vertical cross-section view A-A of the passive optical cavity with protuberances, in accordance with some embodiments of the present invention.

FIG. 1C shows another vertical cross-section view A-A of the passive optical cavity 103 with protuberances 105, in accordance with some embodiments of the present invention. In the example configuration of FIG. 1C, the passive optical cavity 103 has a stepped shape in which a central region of the passive optical cavity 103 has a vertical thickness d5 that is greater than a vertical thickness d3 of inner and outer portions of the passive optical cavity 103, formed inside and outside, respectively of the central region of the passive optical cavity 103. Each of the protuberances 105 is a continuance of the inner portion of the passive optical cavity 103 and has the vertical thickness d3. In some embodiments, the vertical thickness d3 is within a range extending from about 50 nm to about 150 nm. In some embodiments, the vertical thickness d3 is about 80 nm. It should be understood, however, that in other embodiments the vertical thickness d3 can be either less than 50 nm or greater than 150 nm. In some embodiments, the vertical thickness d5 is within a range extending from about 150 nm to about 300 nm. In some embodiments, the vertical thickness d5 is about 200 nm. It should be understood, however, that in other embodiments the vertical thickness d5 can be either less than 150 nm or greater than 300 nm. Also, in the example configuration of FIG. 1C, the passive optical cavity 103 (not including the protuberance 105) has a radial width d4. In some embodiments, the radial width d4 is within a range extending from about 500 nm to about 3000 nm. In some embodiments, the radial width d4 is about 1200 nm. It should be understood, however, that in other embodiments the radial width d4 can be either less than 500 nm or greater than 3000 nm. Also, in the example configuration of FIG. 1C, the central region of the passive optical cavity 103 has a radial width d6. In some embodiments, the radial width d6 is within a range extending from about 200 nm to about 1000 nm. In some embodiments, the radial width d6 is about 500 nm. It should be understood, however, that in other embodiments the radial width d6 can be either less than 200 nm or greater than 1000 nm. In some embodiments, the example configuration of FIG. 1C may be inverted vertically, such that the central region with vertical thickness d5 protrudes downwards, as opposed to upwards as is shown in FIG. 1C.

FIG. 1A also shows the resonant photodetector device 100 positioned next to a waveguide 101, such that light traveling through the waveguide 101 can couple into the passive optical cavity 103 of the resonant photodetector device 100. The waveguide 101 includes an input portion 101A and an output portion 101B. Incoming light travels through the input portion 101A of the waveguide 101 toward the resonant photodetector device 100. As the light travels through the waveguide 101 near the resonant photodetector device 100, a portion of the light will couple into the passive optical cavity 103 of the resonant photodetector device 100, and a remaining portion of the light will travel on through the output portion 101B of the waveguide 101. The portion of light that couples into the passive optical cavity 103 of the resonant photodetector device 100 is guided around the passive optical cavity 103 and in doing so is able to interact with an absorption region 113 (see FIG. 3A below) to generate electrical charge carriers that can be swept up by an applied electrical field and detected as a photocurrent, thereby electrically signaling detection of the light having traveled through the waveguide 101 past the resonant photodetector device 100. In the example embodiment of FIG. 1A, the waveguide 101 has a non-linear configuration as it curves around the resonant photodetector device 100 with a radius of curvature similar to that of the passive optical cavity 103 of the resonant photodetector device 100. However, it should be understood that in other embodiments the waveguide 101 can be configured to have a shape other than the non-linear shape shown by way of example in FIG. 1A. For example, in some embodiments, the waveguide 101 can have a substantially linear shape as is extends past the resonant photodetector device 100. It should be understood that the waveguide 101 is configured, i.e., shaped, sized, and positioned, to enable coupling of light that travels through the waveguide 101 into the passive optical cavity 103 of the resonant photodetector device 100 as the light travels through the waveguide 101 past the resonant photodetector device 100.

In some embodiments, the material composition and dimensions of the waveguide 101 are configured such that only desired optical modes of light couple into the passive optical cavity 103 of the resonant photodetector device 100. For example, in some embodiments, the waveguide 101 is configured such that coupling of light into the passive optical cavity 103 of the resonant photodetector device 100 is limited to a fundamental optical mode of the light. In various embodiments, the waveguide 101 can be formed of essentially any material through which light can be channeled from an entry location on the waveguide 101 to an exit location on the waveguide 101. For example, in various embodiments, the waveguide 101 can be formed of glass, SiN, $SiO_2$, germanium-oxide, and/or silica, among other materials. In some embodiments, the waveguide 101 is configured to maintain a polarization of light as it travels through the waveguide 101.

Figure 1D:
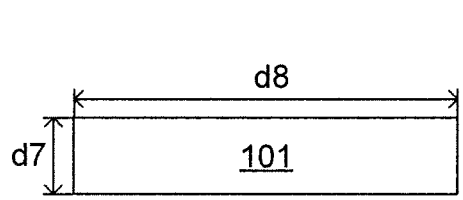
FIG. 1D shows a vertical cross-section view B-B of the waveguide, in accordance with some embodiments of the present invention.

FIG. 1D shows a vertical cross-section view B-B of the waveguide 101, in accordance with some embodiments of the present invention. In the example configuration of FIG. 1D, the waveguide 101 has a substantially uniform vertical thickness d7. In some embodiments, the vertical thickness d7 is within a range extending from about 30 nm to about 300 nm. In some embodiments, the vertical thickness d7 is about 80 nm. It should be understood, however, that in other embodiments the vertical thickness d7 can be either less than 30 nm or greater than 300 nm. Also, in the example configuration of FIG. 1D, the waveguide 101 has a width d8. In some embodiments, the width d8 is within a range extending from about 300 nm to about 1000 nm. In some embodiments, the width d8 is about 400 nm. It should be understood, however, that in other embodiments the width d8 can be either less than 300 nm or greater than 1000 nm.

Figure 1E:
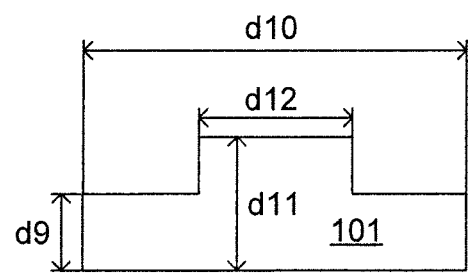
FIG. 1E shows another vertical cross-section view B-B of the waveguide, in accordance with some embodiments of the present invention.

FIG. 1E shows another vertical cross-section view B-B of the waveguide 101, in accordance with some embodiments of the present invention. In the example configuration of FIG. 1E, the waveguide 101 has a stepped shape in which a central region of the waveguide 101 has a vertical thickness d11 that is greater than a vertical thickness d9 of inner and outer portions of the waveguide 101, formed inside and outside, respectively of the central region of the waveguide 101. In some embodiments, the vertical thickness d9 is within a range extending from about 50 nm to about 150 nm. In some embodiments, the vertical thickness d9 is about 80 nm. It should be understood, however, that in other embodiments the vertical thickness d9 can be either less than 50 nm or greater than 150 nm. In some embodiments, the vertical thickness d11 is within a range extending from about 150 nm to about 300 nm. In some embodiments, the vertical thickness d11 is about 200 nm. It should be understood, however, that in other embodiments the vertical thickness d11 can be either less than 150 nm or greater than 300 nm. Also, in the example configuration of FIG. 1E, the waveguide 101 has a width d10. In some embodiments, the width d10 is within a range extending from about 300 nm to about 1000 nm. In some embodiments, the width d10 is about 400 nm. It should be understood, however, that in other embodiments the width d10 can be either less than 300 nm or greater than 1000 nm. Also, in the example configuration of FIG. 1E, the central region of the waveguide 101 has a width d12. In some embodiments, the width d12 is within a range extending from about 200 nm to about 1000 nm. In some embodiments, the width d12 is about 500 nm. It should be understood, however, that in other embodiments the width d12 can be either less than 200 nm or greater than 1000 nm. In some embodiments, the example configuration of FIG. 1E may be inverted vertically, such that the central region with vertical thickness d11 protrudes downwards, as opposed to upwards as is shown in FIG. 1E.

FIG. 1A also shows an integrated thermal tuner 107 formed within an inner cavity region of the passive optical cavity 103 of the resonant photodetector device 100. In some embodiments, the integrated thermal tuner 107 is defined as a resistance heating device. The integrated thermal tuner 107 can be operated to control a temperature of the passive optical cavity 103, which in turn controls an effective refractive index of the passive optical cavity 103. In this manner, the integrated thermal tuner 107 can be operated to control the type and order of optical mode that couples from the waveguide 101 into the passive optical cavity 103. For example, the integrated thermal tuner 107 can be controlled to maintain a prescribed temperature of the passive optical cavity 103 at which the refractive index of the passive optical cavity 103 allows for substantially exclusive coupling of an optical mode of particular azimuthal mode order (i.e., the integer number of wavelengths around the circumference of the passive optical cavity) from the waveguide 101 to the passive optical cavity 103. The integrated thermal tuner 107 is described further below with regard to FIG. 7.

Figure 2:
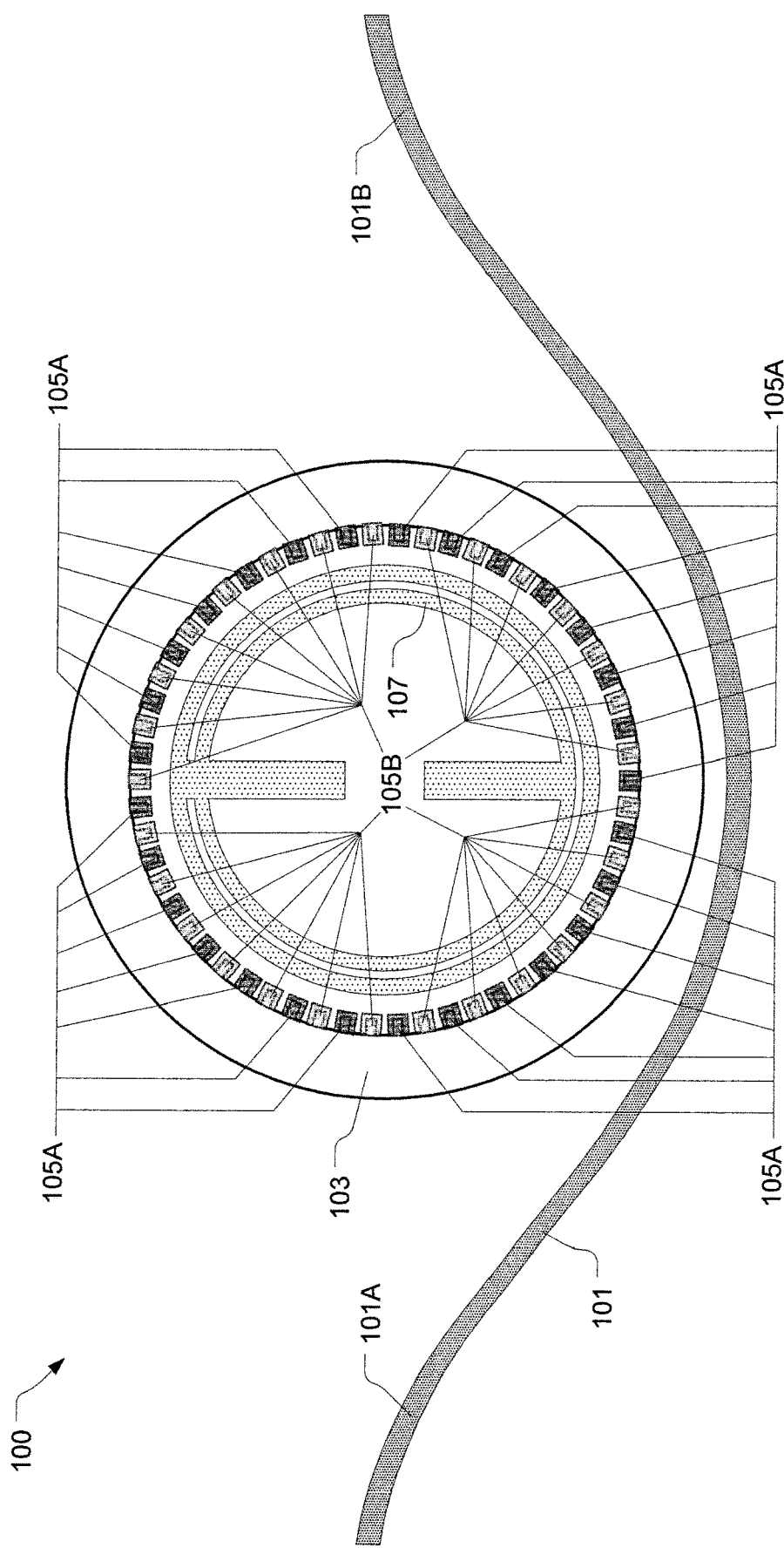
FIG. 2 shows the resonant photodetector device of FIG. 1A with implant regions formed over the protuberances, in accordance with some embodiments of the present invention.

FIG. 2 shows the resonant photodetector device 100 of FIG. 1A with implant regions formed over the protuberances 105, in accordance with some embodiments of the present invention. The implant regions are formed such that each protuberance 105 has different type of doping than its two neighboring protuberances 105. In this manner, the doping type applied to the protuberances 105 alternates from one protuberance 105 to another around the inner perimeter of the passive optical cavity 103. For example, FIG. 2 shows protuberances 105A having a first doping type, and protuberances 105B having a second doping type, where the protuberances 105A and 105B are formed in an alternating manner around the inner perimeter of the passive optical cavity 103. In some example embodiments, the protuberances 105A have an n-type doping, and the protuberances 105B have a p-type doping. In some example embodiments, the protuberances 105A have a p-type doping, and the protuberances 105B have an n-type doping. It should be understood that in various embodiments the protuberances 105A and 105B can have essentially any type of doping so long as adjacently positioned protuberances 105A and 105B have different electrical conductivity characteristics relative to each other.

Figure 3A:
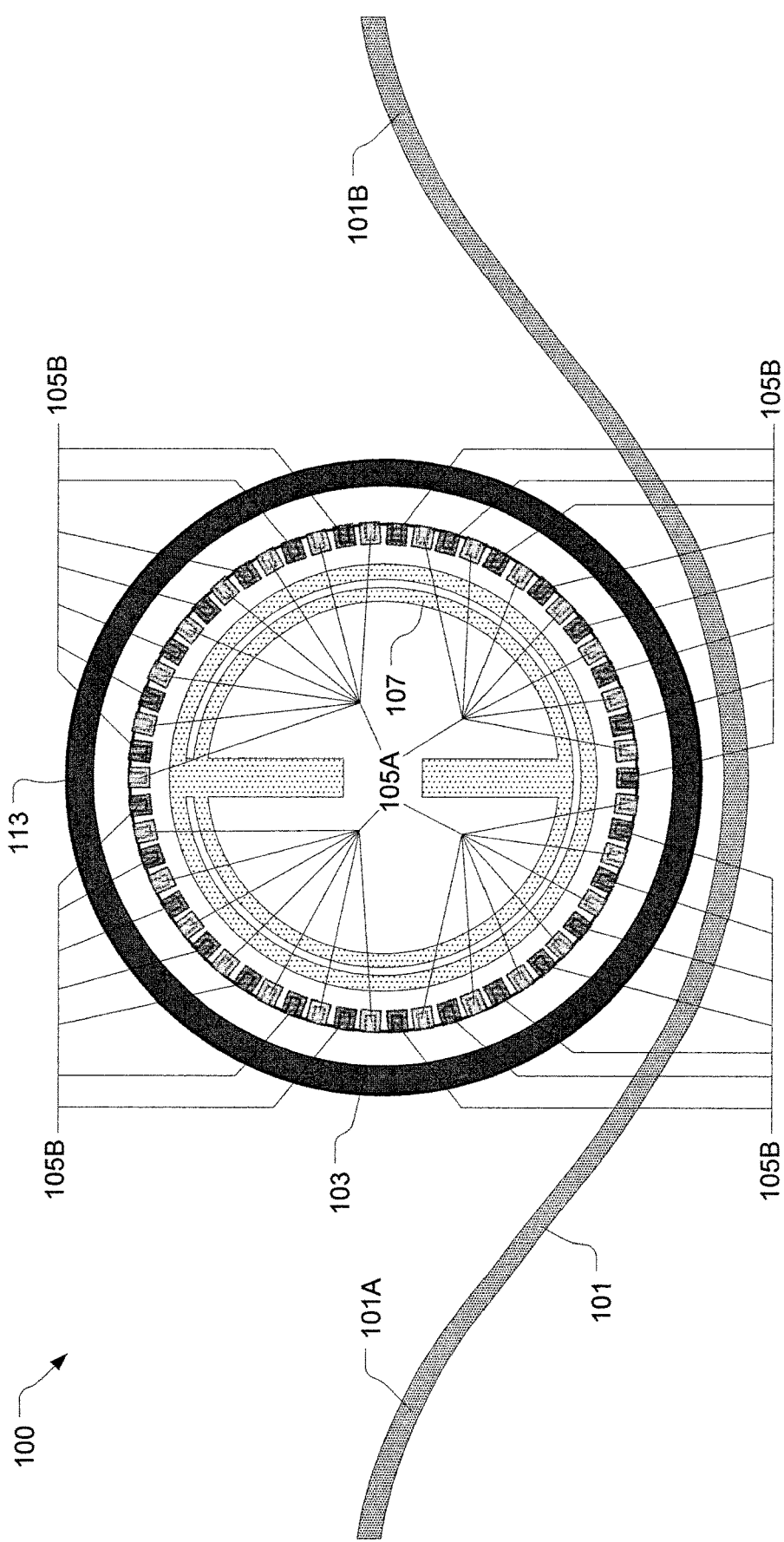
FIG. 3A shows the resonant photodetector device of FIG. 2 with an absorption region formed within the passive optical cavity, in accordance with some embodiments of the present invention.
Figure 3B:
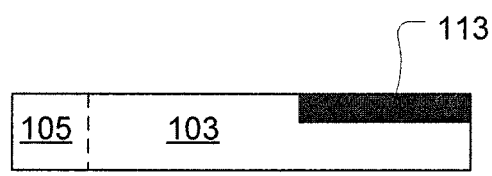
FIG. 3B shows the vertical cross-section view A-A of the passive optical cavity, as reference in FIG. 1A, with the absorption region formed within the passive optical cavity, in accordance with some embodiments of the present invention.
Figure 3C:
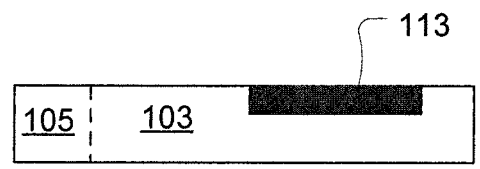
FIG. 3C shows the vertical cross-section view A-A of the passive optical cavity, as reference in FIG. 1A, with the absorption region formed within the passive optical cavity without extending to/through the outer perimeter of the passive optical cavity, in accordance with some embodiments of the present invention.

FIG. 3A shows the resonant photodetector device 100 of FIG. 2 with an absorption region 113 formed within the passive optical cavity 103, in accordance with some embodiments of the present invention. FIG. 3B shows the vertical cross-section view A-A of the passive optical cavity 103, as reference in FIG. 1A, with the absorption region 113 formed within the passive optical cavity 103, in accordance with some embodiments of the present invention. In the example of FIG. 3B, the absorption region 113 extends radially to/through the outer perimeter of the passive optical cavity 103. However, in other embodiments, the absorption region 113 can be formed within the passive optical cavity 103 without extending to/through the outer perimeter of the passive optical cavity 103. For example, FIG. 3C shows the vertical cross-section view A-A of the passive optical cavity 103, as reference in FIG. 1A, with the absorption region 113 formed within the passive optical cavity 103 without extending to/through the outer perimeter of the passive optical cavity 103, in accordance with some embodiments of the present invention. The absorption region 113 is where a majority of photoabsorption occurs within the resonant photodetector device 100. In other words, the absorption region 113 is where photons (of the light that couples into the passive optical cavity 103 from the waveguide 101) are absorbed to generate charge carriers, i.e., to generate free electrons and corresponding "holes" (positive charges due to movement of free electrons). The charge carriers generated by absorption of light with the absorption region 113 are collected through operation of the resonant photodetector device 100 to detect when light has entered the passive optical cavity 103, and hence to detect when light has traveled along the waveguide 101 past the resonant photodetector device 100. In various embodiments, the absorption region 113 is formed of SiGe, Ge, polycrystalline silicon, or essentially any other material that is capable of absorbing light to generate charge carriers. In some embodiments, the absorption region 113 extends through a majority of the entire vertical thickness of the passive optical cavity 103. And, in some embodiments, the absorption region 113 extends through essentially the entire vertical thickness of the passive optical cavity 103.

Figure 4:
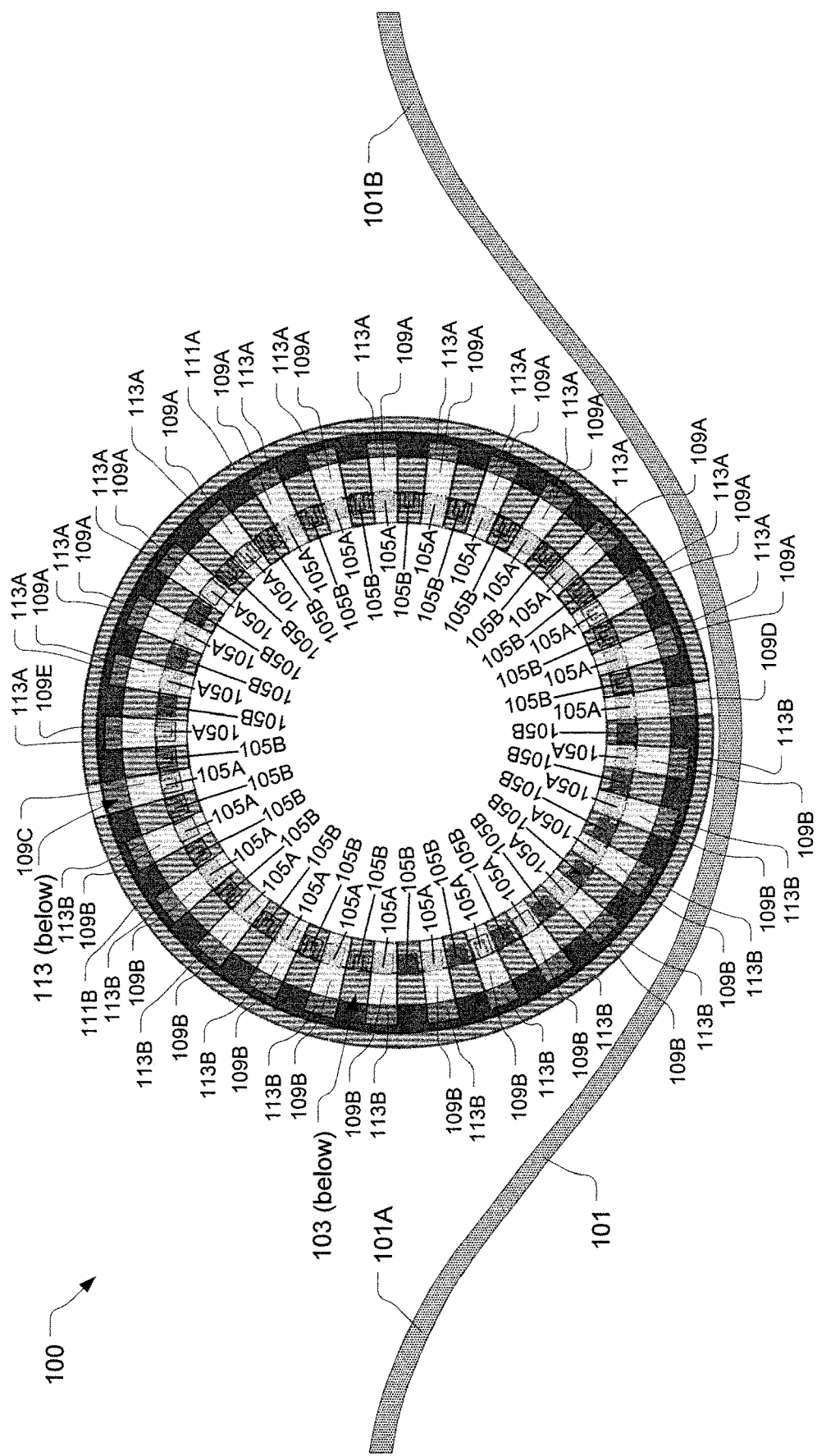
FIG. 4 shows the resonant photodetector device of FIG. 3A with an example configuration of radially extending implant regions of a first doping type, and with an example configuration of implant regions of a second doping type, in accordance with some embodiments of the present invention.

FIG. 4 shows the resonant photodetector device 100 of FIG. 3A with an example configuration of radially extending implant regions 109A, 109B of a first doping type, and with an example configuration of implant regions 111A, 111B of a second doping type, in accordance with some embodiments of the present invention. To facilitate presentation of features in FIG. 4, the integrated thermal tuner 107 is not shown, but is present in the same manner as shown in FIG.

2. The implant region 111A includes radially extending implant regions connected to an outer peripheral implant region band. Similarly, the implant region 111A includes radially extending implant regions connected to an outer peripheral implant region band. In some embodiments, the first doping type of the implant regions 109A, 109B matches the doping type implanted within the protuberances 105A that are overlapped by the implant regions 109A, 109B. Also, in some embodiments, the second doping type of the implant regions 111A, 111B matches the doping type implanted within the protuberances 105B that are overlapped by the implant regions 111A, 111B. The overlap of each implant region 109A with its corresponding doped protuberance 105A establishes an electrical connection between the implant region 109A and its corresponding doped protuberance 105A. Similarly, the overlap of each implant region 109B with its corresponding doped protuberance 105A establishes an electrical connection between the implant region 109B and its corresponding doped protuberance 105A. Also, the overlap of implant region 111A with its corresponding doped protuberances 105B establishes an electrical connection between the implant region 111A and its corresponding doped protuberances 105B. Similarly, the overlap of implant region 111B with its corresponding doped protuberances 105B establishes an electrical connection between the implant region 111B and its corresponding doped protuberances 105B. Also, it should be understood that the outer peripheral implant region band of the implant region 111A serves to electrically connect each radially extending portion of the implant region 111A, which also electrically connects each of the doped protuberances 105B that are overlapped by the radially extending portions of the implant region 111A. And, it should be understood that the outer peripheral implant region band of the implant region 111B serves to electrically connect each radially extending portion of the implant region 111B, which also electrically connects each of the doped protuberances 105B that are overlapped by the radially extending portions of the implant region 111B. In this manner, each of the radially extending implant regions 109A, 109B of the first doping type can be independently electrically contacted through its corresponding protuberance 105A having the first doping type. And, each of the radially extending portions of the implant regions 111A, 111B of the second doping type can be independently electrically contacted through its corresponding protuberance 105B having the second doping type.

FIG. 4 shows the resonant photodetector device 100 configured as a two-section detector, in accordance with some embodiments of the present invention. An implant region 109C of the first doping type and an implant region 109D of the first doping type are formed to electrically separate the implant region 111A of the second doping type from the implant region 111B of the second doping type. In this manner, the implant regions 109C and 109D define two isolated absorption regions 113A and 113B, where the absorption region 113A extends around and beneath the junctions that exist between the implant region 111A and the implant regions 109A, and where the absorption region 113B extends around and beneath the junctions that exist between the implant region 111B and the implant regions 109B. Therefore, it should be understood that the implant region 109C of the first doping type and an implant region 109D of the first doping type effectively divide the resonant photodetector device 100 into two sections. In the example of FIG. 4, the implant regions 109C and 109D are positioned to effectively divide the resonant photodetector device 100 into approximately two halves. It should be understood that in various embodiments more than two segmenting implant regions of the first doping type, like the implant regions 109C and 109D, can be formed to divide the resonant photodetector device 100 into more than two sections. In various embodiments, the absorption region 113 and the implant regions 109A, 109B, 111A, and 111B are designed to maximize the responsivity of the resonant photodetector device 100 with respect to detection of light that couples into the resonant photodetector device 100 from the waveguide 101.

Figure 5A:
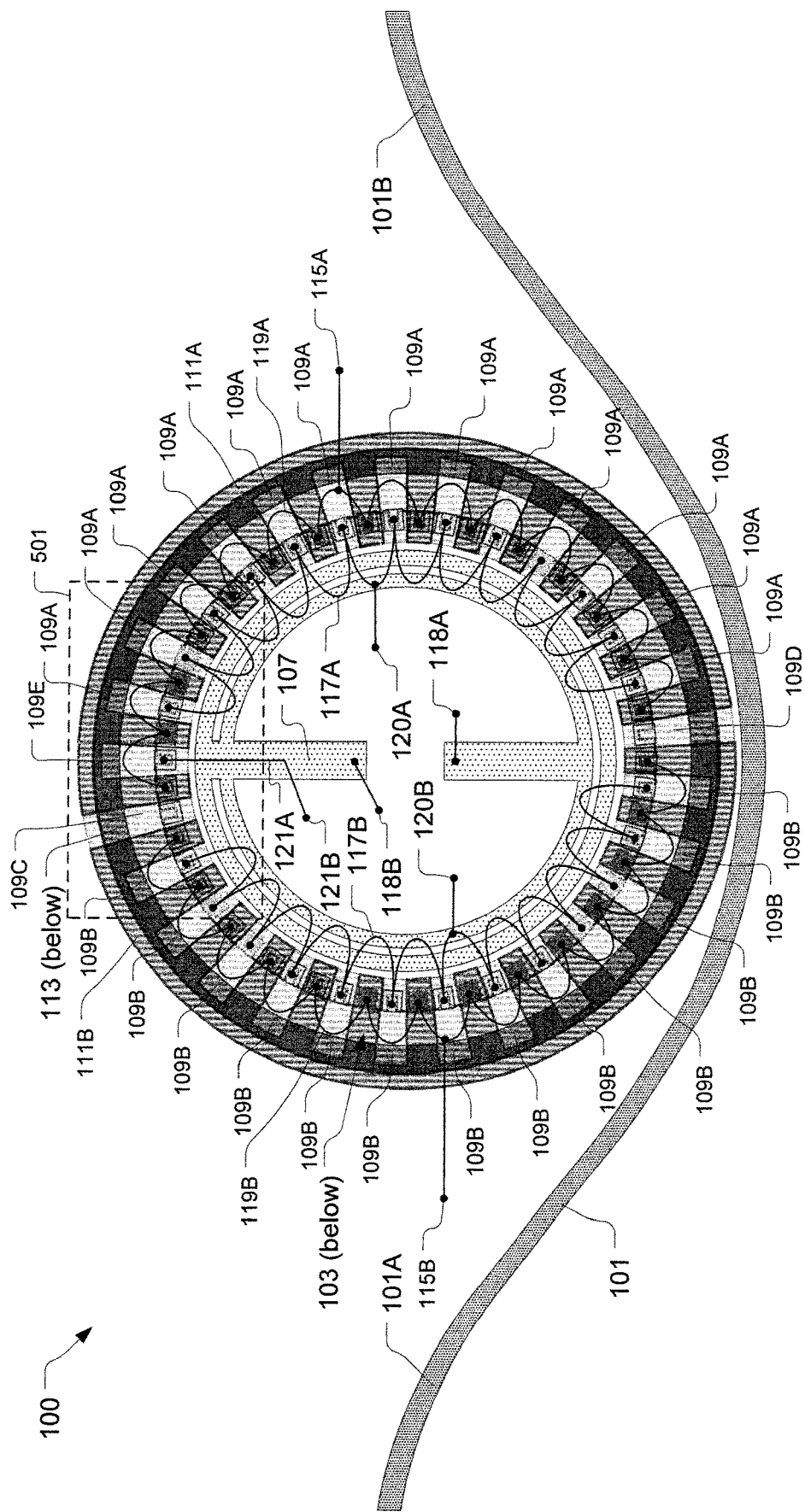
FIG. 5A shows an example wiring schematic of the resonant photodetector device of FIG. 4A, in accordance with some embodiments of the present invention.

The implant regions 109A, 109B, 111A, and 111B are patterned to create electrically conductive paths along which photo-generated charge carriers are collected. Electrical contacts, e.g., metal contacts, can be formed to physically and electrically contact the doped protuberances 105A and 105B, to provide for electrical connection with the implant regions 109A, 109B, 111A, and 111B by way of their corresponding doped protuberances 105A and 105B. FIG. 5A shows an example wiring schematic of the resonant photodetector device 100 of FIG. 4A, in accordance with some embodiments of the present invention. Through corresponding electrical contacts, the doped protuberances 105A of the implant regions 109A can be electrically connected together through wiring 117A. The wiring 117A can be electrically connected to an external contact 120A for electrical connection to signal processing circuitry. Through corresponding electrical contacts, the doped protuberances 105B of the implant region 111A can be electrically connected together through wiring 119A. The wiring 119A can be electrically connected to an external contact 115A for electrical connection to signal processing circuitry. In this manner, a combination of the absorption region 113A, the implant regions 109A, the implant region 111A, the wiring 117A, the wiring 119A, the external contact 120A, and the external contact 115A form an independently operable photodetector section 100A within the resonant photodetector device 100 (see FIG. 6D).

With further regard to FIG. 5A, through corresponding electrical contacts, the doped protuberances 105A of the implant regions 109B can be electrically connected together through wiring 117B. The wiring 117B can be electrically connected to an external contact 120B for electrical connection to signal processing circuitry. Through corresponding electrical contacts, the doped protuberances 105B of the implant region 111B can be electrically connected together through wiring 119B. The wiring 119B can be electrically connected to an external contact 115B for electrical connection to signal processing circuitry. In this manner, a combination of the absorption region 113B, the implant regions 109B, the implant region 111B, the wiring 117B, the wiring 119B, the external contact 120B, and the external contact 115B form an independently operable photodetector section 100B within the resonant photodetector device 100 (see FIG. 6D).

FIG. 5A also shows a doped protuberance 105A of an implant region 109E electrically connected through wiring 121A to an external contact 121B. The combination of the absorption region 113A, the implant region 109E, portions of the implant region 111A immediately surrounding the implant region 109E, the wiring 121A, and the external contact 121B form another independently operable photodetector section that can be used to monitor a total optical power coupled into the passive optical cavity 103 from the waveguide 101. The monitored total optical power can be used as a feedback signal for operation of the integrated thermal tuner 107 to assist control circuitry of the integrated thermal tuner 107 in locating and maintaining a temperature setting that couples a maximum amount of light into the passive optical cavity 103 from the waveguide 101. Additionally, FIG. 5A shows external contacts 118A and 118B for driving electrical current through the integrated thermal tuner 107.

Figure 5B:
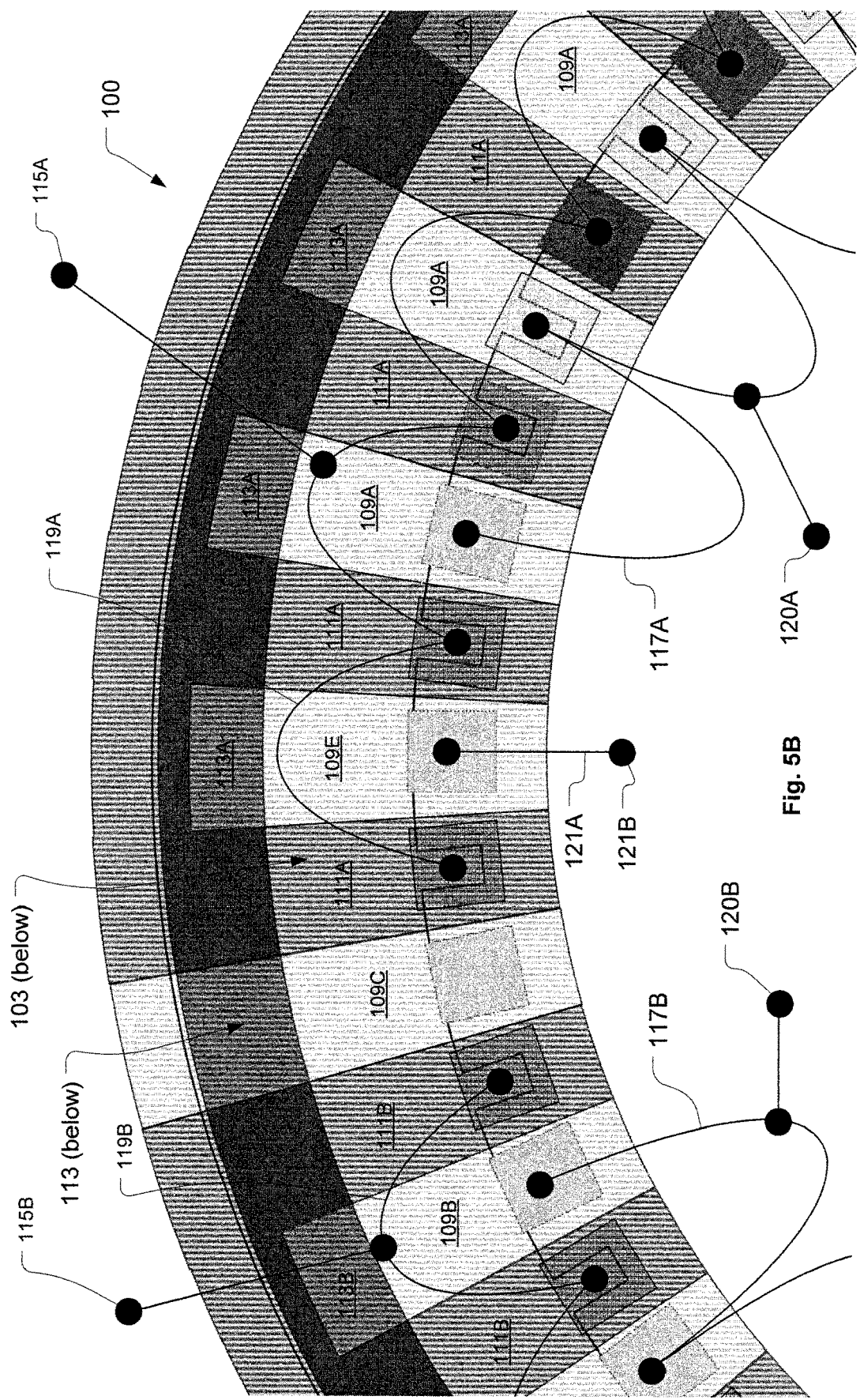
FIG. 5B shows an enlarged view of a section of the resonant photodetector device as referenced in FIG. 5A, in accordance with some embodiments of the present invention.

FIG. 5B shows an enlarged view of a section 501 of the resonant photodetector device 100 as referenced in FIG. 5A, in accordance with some embodiments of the present invention. To facilitate presentation of features in FIG. 5B, the integrated thermal tuner 107 is not shown, but can be present in the same manner as shown in FIG. 2. In some embodiments, a given independently operable photodetector, e.g., 100A, 100B, can be operated in a reverse bias mode in which p-type implant regions are biased to a lower voltage than n-type implant regions. For example, if we consider that the implant regions 109A are p-type implant regions, and the implant region 111A is an n-type implant region, then the implant regions 109A are biased to a lower voltage than the implant region 111A. This creates an electric field inside the absorption region 113A that is used to sweep out and collect the photo-generated charge carriers, i.e., electrons and holes. The charge carriers flow through the electrical nodes to which the implant regions 109A and 111A are connected, i.e., on the external contacts 115A and 120A, which causes photocurrent to flow through the external contacts 115A and 120A that are connected to the signal processing circuitry (electrical receiver circuit). In this manner, the photocurrent from the external contacts 115A/120A and 115B/120B of the first and second halves of the resonant photodetector device 100, respectively, can be used as inputs to the signal processing circuitry (electrical receiver circuit). And, the photocurrent from the power monitor external contact 121B can be used as a feedback signal input to control circuitry that controls the current flowing through the external contacts 118A/118B of the integrated thermal tuner 107. Also, in some embodiments, a given independently operable photodetector, e.g., 100A, 100B, can be operated in a forward bias mode in which n-type implant regions are biased to a lower voltage than p-type implant regions.

In some embodiments, the implant regions 109A and 109B are p-type implant regions, and the implant regions 111A and 111B are n-type implant regions. In some embodiments, the implant regions 109A and 109B are n-type implant regions, and the implant regions 111A and 111B are p-type implant regions. Therefore, it should be understood that in various embodiments the "polarity" of the implant regions 109A/109B/109C/109D/109E and 111A/111B can be flipped (i.e., n-type becomes p-type, p-type becomes n-type), either globally for the entire resonant photodetector device 100, or locally for each section of the resonant photodetector device 100, i.e., for each independently operable photodetector 100A/100B within the resonant photodetector device 100. In the latter case, the dedicated isolation implant regions 109C and 109D may not be necessary when creating sectioned detectors. Also, if additional electrical isolation is desired, or if the voltage across an isolation region junction causes junction breakdown or punch-through, the isolation implant regions 109C/109D may be widened. Also, in some embodiments, additional isolation regions like 109C/109D may be added to create a set of reverse-biased diodes.

For operation of a given independently operable photodetector, e.g., 100A, 100B, in reverse bias mode, a negative voltage is applied to the p-type implant regions and a positive voltage is applied to the n-type implant regions, and the positive voltage is greater than the negative voltage. For operation of a given independently operable photodetector, e.g., 100A, 100B, in forward bias mode, a positive voltage is applied to the p-type implant regions and a negative voltage is applied to the n-type implant regions, and the positive voltage is greater than the negative voltage. Also, in some embodiments, zero voltage can be applied to both the p-type implant regions and the n-type implant regions, such that intrinsic electrical conduction properties of the absorption region 113A/113B and the implant regions 109A/109B and 111A/111B are utilized to support flow of the generated photocurrent.

Figure 5C:
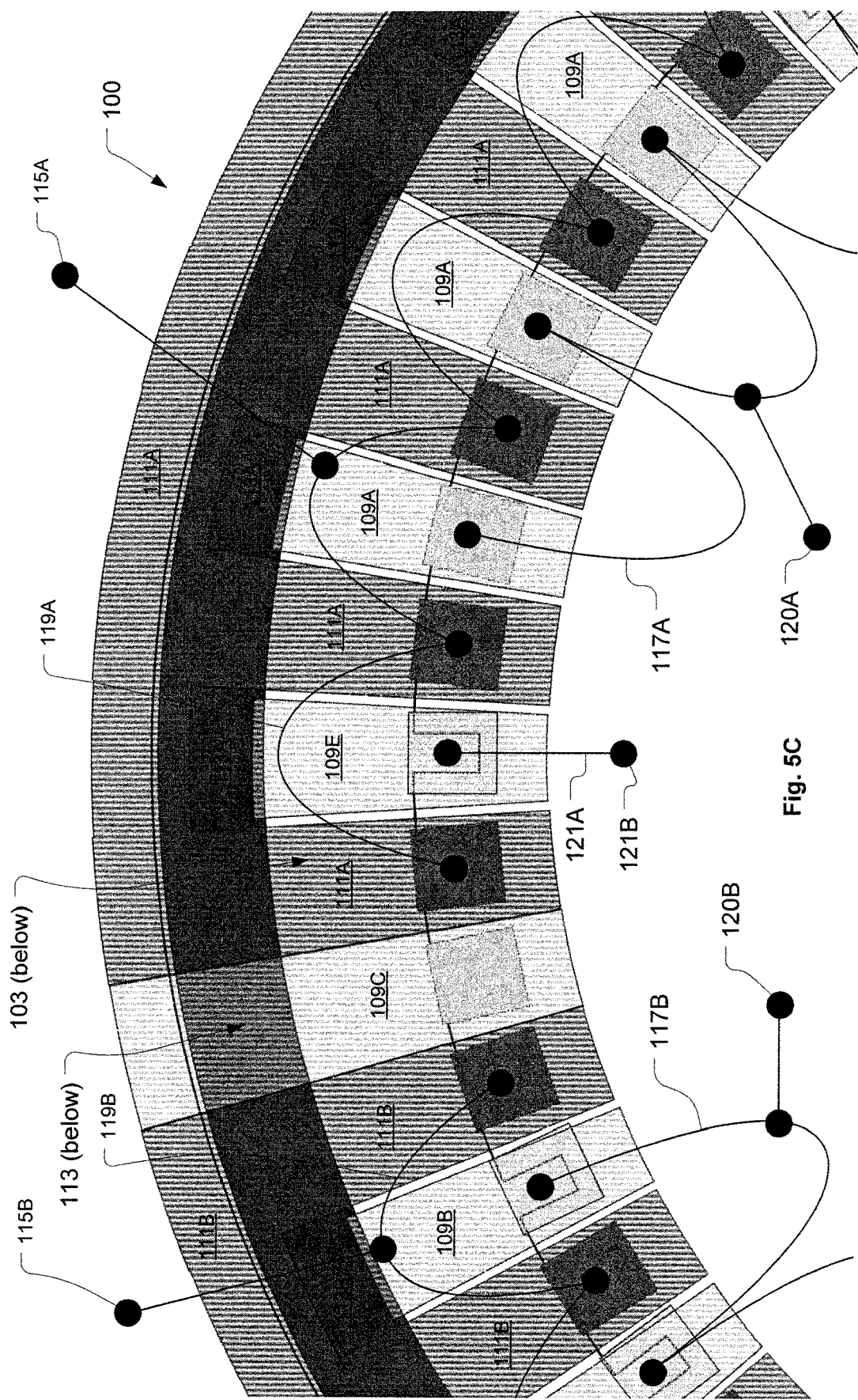
FIG. 5C shows an enlarged view of the section of the resonant photodetector device as referenced in FIG. 5A in which the implant regions are formed in a spaced apart manner from their surrounding implant regions, in accordance with some embodiments of the present invention.

FIG. 5C shows an enlarged view of the section 501 of the resonant photodetector device 100 as referenced in FIG. 5A in which the implant regions 109A, 109B, and 109E are formed in a spaced apart manner from their surrounding implant regions 111A or 111B, in accordance with some embodiments of the present invention. To facilitate presentation of features in FIG. 5C, the integrated thermal tuner 107 is not shown, but can be present in the same manner as shown in FIG. 2. In the configuration of FIG. 5C, the implant regions 109A, 109B, and 109E of the first doping type do not abut the surrounding implant regions 111A and 111B of the second doping type. A separation distance between a given implant region 109A/109B/109E of the first doping type and its surrounding implant region 111A/111B can be used to define a size of an intrinsically-doped region to avoid unnecessary free carrier absorption. For example, a large separation distance will define a large intrinsic region. The separation distance design parameter can be used to tradeoff optical cavity responsivity with other characteristics, such as transit time of generated carriers, cavity finesse/quality factor, or series resistance. Furthermore, the two absorption regions 113A and 113B can be formed in a discontinuous configuration to avoid unnecessary carrier generation in the implant regions 109A/109B/109E of the first doping type and/or in the implant regions 111A/111B of the second doping type.

Figure 6A:
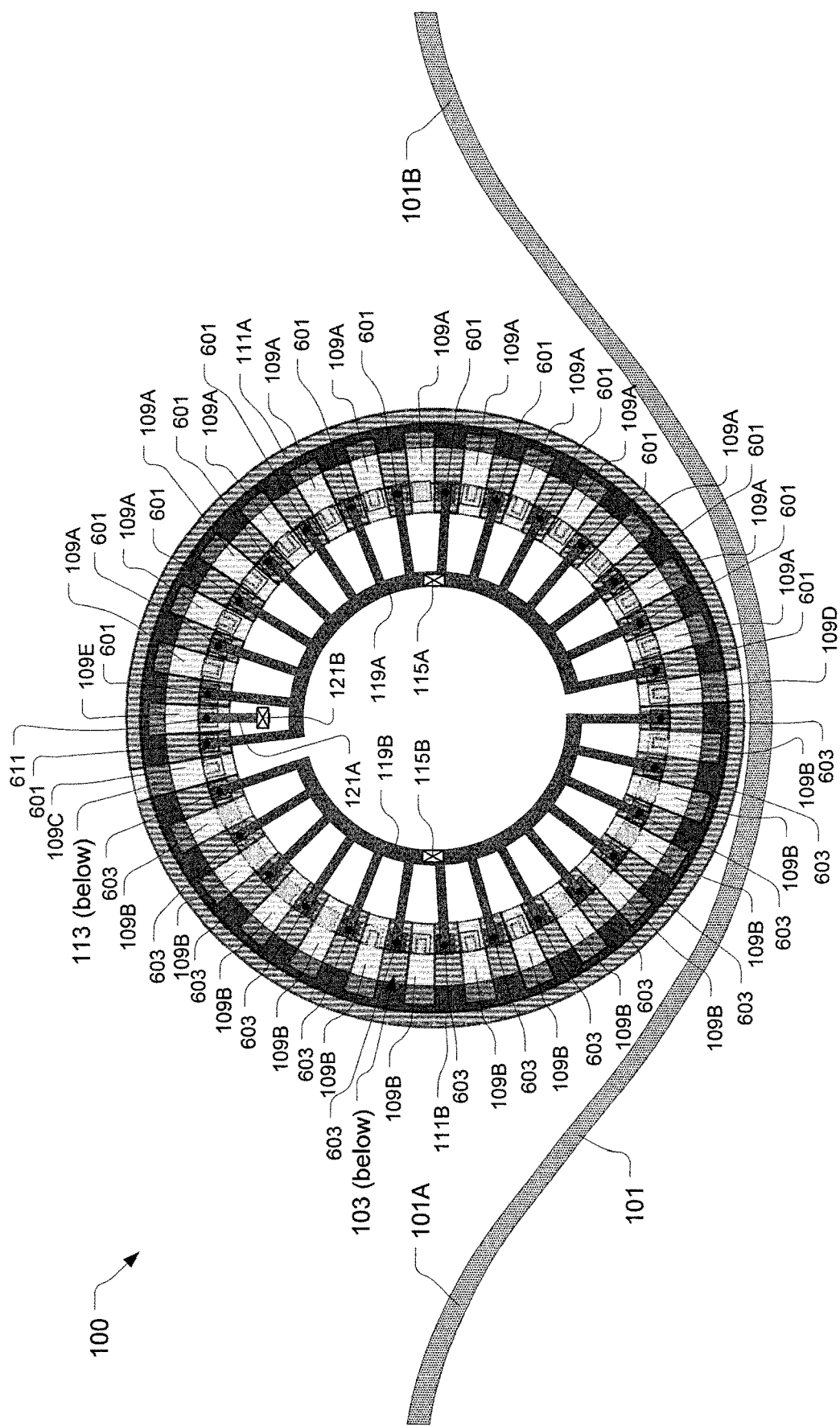
FIG. 6A shows an example wiring configuration for implementing the wiring schematic of the resonant photodetector device of FIG. 5A, in accordance with some embodiments of the present invention.

FIG. 6A shows an example wiring configuration for implementing the wiring schematic of the resonant photodetector device 100 of FIG. 5A as it relates to the wiring 119A, 119B, and 121A, in accordance with some embodiments of the present invention. To facilitate presentation of features in FIG. 6A, the integrated thermal tuner 107 is not shown, but can be present in the same manner as shown in FIG. 2. The wiring 119A is implemented by conductive structures that connect to electrical contacts 601 that connect to the doped protuberances 105B. Similarly, the wiring 119B is implemented by conductive structures that connect to electrical contacts 603 that connect to the doped protuberances 105B. The wiring 121A is implemented by a conductive structure that connects to an electrical contact 611 that connects to the corresponding doped protuberance 105A. The external contact 115A is physically and electrically connected to the conductive structure of the wiring 119A. The external contact 115B is physically and electrically connected to the conductive structure of the wiring 119B. The external contact 121B is physically and electrically connected to the conductive structure of the wiring 121A.

Figure 6B:
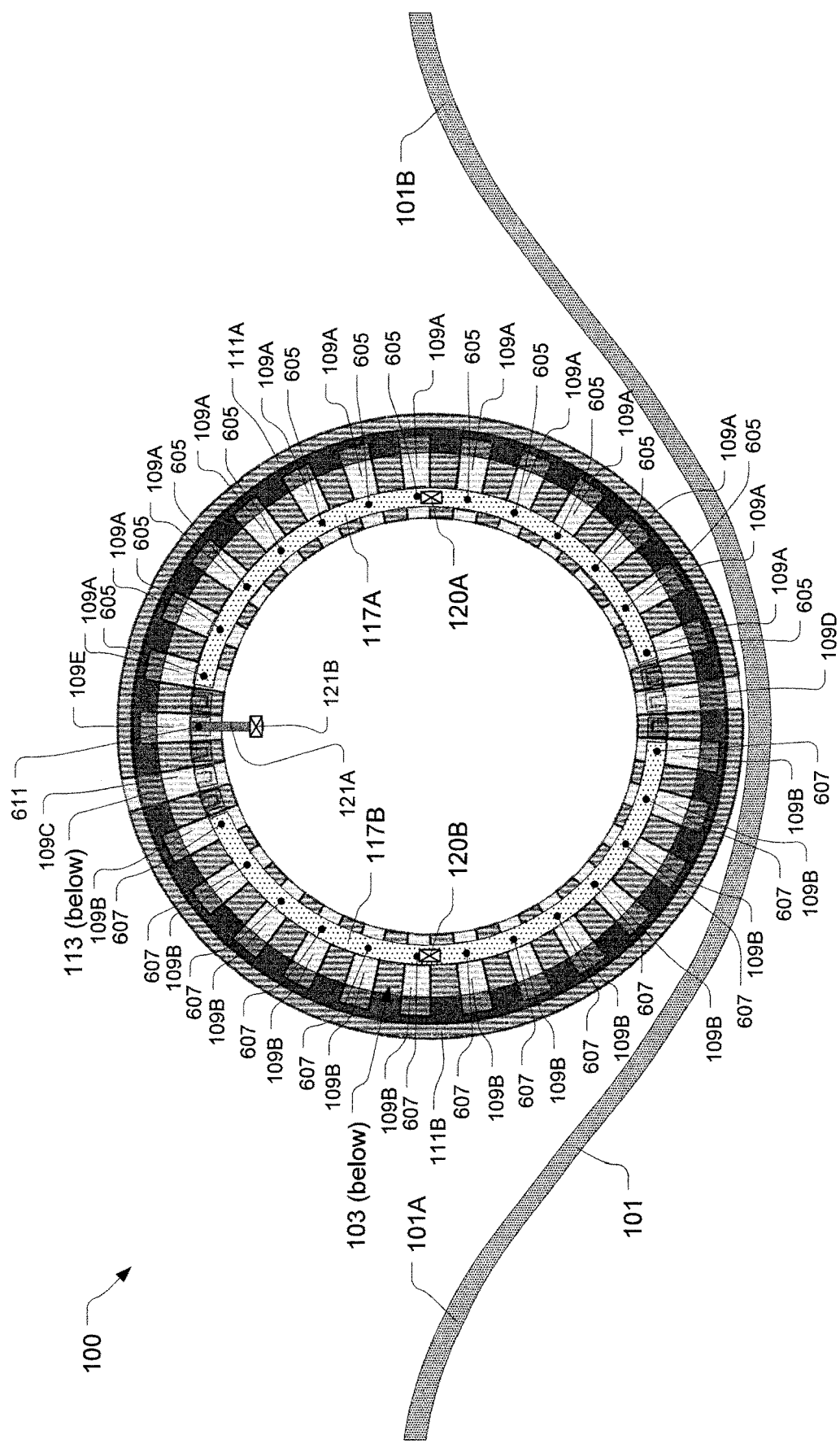
FIG. 6B shows an example wiring configuration for implementing the wiring schematic of the resonant photodetector device of FIG. 5A, in accordance with some embodiments of the present invention.

FIG. 6B shows an example wiring configuration for implementing the wiring schematic of the resonant photodetector device 100 of FIG. 5A as it relates to the wiring 117A and 117B, in accordance with some embodiments of the present invention. To facilitate presentation of features in FIG. 6B, the integrated thermal tuner 107 is not shown, but can be present in the same manner as shown in FIG. 2. The wiring 117A is implemented by conductive structures that connect to electrical contacts 605 that connect to the doped protuberances 105A. Similarly, the wiring 117B is implemented by conductive structures that connect to electrical contacts 607 that connect to the doped protuberances 105A. The external contact 120A is physically and electrically connected to the conductive structure of the wiring 117A. The external contact 120B is physically and electrically connected to the conductive structure of the wiring 117B.

Electrical contact to the passive optical cavity 103 is supported by the doped protuberances 105A and 105B on the inner sidewall of the passive optical cavity 103. The electrical connectivity of each of these doped protuberances 105A and 105B is defined by the wiring 115A, 115B, 117A, 117B, and 121A formed in backend metal layers. A modern CMOS process typically supports up to 6 or more levels of metal layers to facilitate complex wiring schemes. Many different electrical configurations can be supported by connecting the doped protuberances 105A and 105B together in different ways. For example, for resonant photodetector device 100 split into two photodetector sections and with a total number (N) of doped protuberances 105A/105B, approximately N/2 of the doped protuberances 105A/105B are used for the first half of the resonant photodetector device 100, and approximately N/2 of the doped protuberances 105A/105B are used for the second half of the resonant photodetector device 100, and at least one doped protuberance 105A is used for power monitoring in connection with the power monitor external contact 121B. The number of resulting electrical external contacts (pins) depends on the number of independently operable sections of the resonant photodetector device 100 that require independent electrical biases. For the passive optical cavity 103 having N doped protuberances 105A/105B and 2 heater contacts 118A, 118B, a total number (P) of electrical external contacts (pins) is bound to P∈[3,N+2]. The example resonant photodetector device 100 includes the two external contacts 115A, 120A for the first half detector, two external contacts 115B, 120B for the second half detector, one external contact 121B for power monitoring, and two external contacts 118A, 118B for the integrated thermal tuner 107, resulting in a total of seven external contacts (P=7).

Figure 6C:
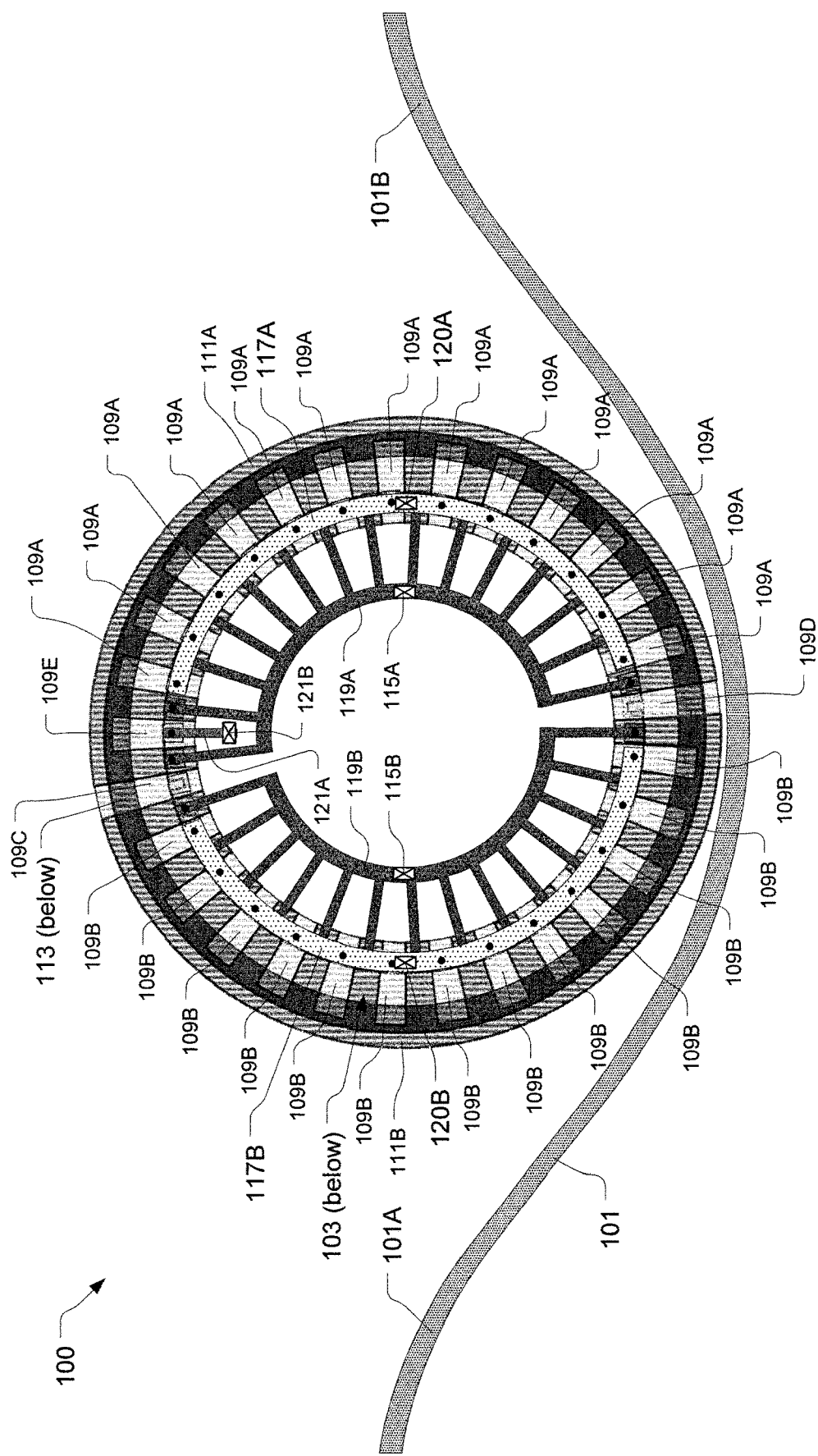
FIG. 6C shows implementation of the combined wiring of FIGS. 6A and 6B, in accordance with some embodiments of the present invention.
Figure 6D:
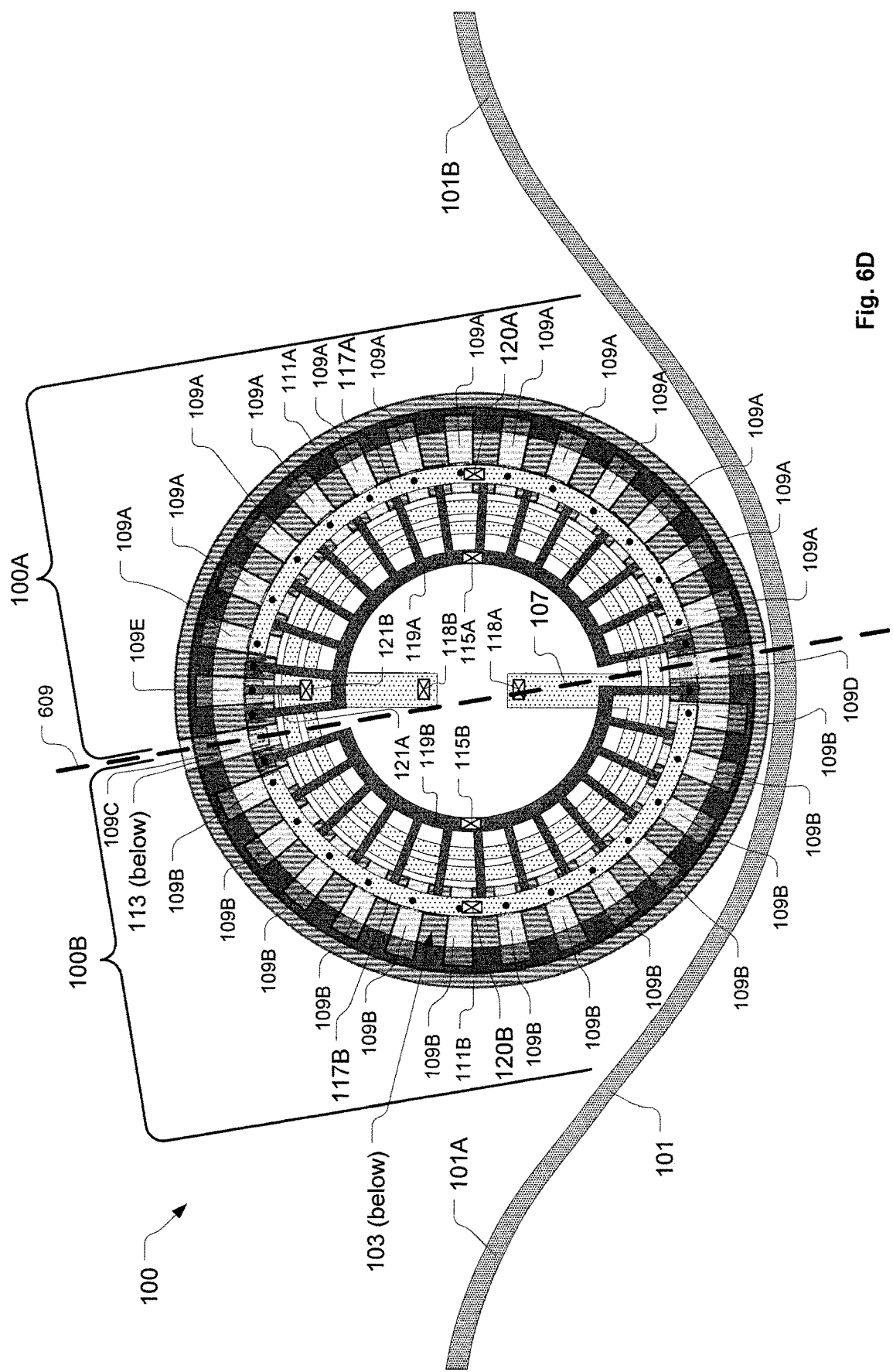
FIG. 6D shows the resonant photodetector device configuration of FIG. 6C with the integrated thermal tuner shown below the conductive structures for the wiring, in accordance with some embodiments of the present invention.

FIG. 6C shows implementation of the combined wiring of FIGS. 6A and 6B as it relates to the wiring 119A, 119B, 121A, 117A, and 117B, in accordance with some embodiments of the present invention. It should be understood that the conductive structure for the wiring 117A is formed in a metal layer above the conductive structures for the wiring 119A. Similarly, it should be understood that the conductive structure for the wiring 117B is formed in a metal layer above the conductive structures for the wiring 119B. FIG. 6D shows the resonant photodetector device 100 configuration of FIG. 6C with the integrated thermal tuner 107 shown below the conductive structures for the wiring 119A and 119B, in accordance with some embodiments of the present invention. In some embodiments, the wiring 119A, 119B, 121A, 117A, and 117B is routed to electrical circuits for signal processing (receiving) and feedback control. The electrical circuits can be either monolithically integrated such that the transistors of the electrical circuits are fabricated in the same process as the resonant photodetector device 100, or the electrical circuits can be integrated heterogeneously. Heterogeneous integration includes, but is not limited to, multi-chip modules, board-level integration, and three-dimensional integration (such as through use of silicon vias, through-oxide vias, wafer-to-wafer bonding, among other options).

When the resonant photodetector device 100 is connected to a receiver circuit which expects a differential input, the resonant photodetector device 100 can be connected in a manner described as follows. The resonant photodetector device 100 can be split into two photodetectors, such as detectors 100A and 100B as shown in FIG. 6D, using two isolation implant regions 109C/109D. The absorption region 113A of the first detector 100A has its cathode(s) (n-type contact(s)) connected to a high positive voltage (+VPD) and has its anode(s) (p-type contact(s)) connected to the receiver input plus (IN+) terminal. The absorption region 113B of the second detector 100B has its anode(s) connected to a low negative voltage (−VPD) and has its cathode(s) connected to the receiver input minus (IN−) terminal. When light couples into the resonant photodetector device 100 from the waveguide 101, the first detector 100A pulls the receiver input plus (IN+) terminal up, towards the high positive voltage (+VPD), and the second detector 100B pulls the receiver input minus (IN−) terminal down, towards the low negative voltage (−VPD), resulting in pseudo-differential operation. For the resonant photodetector device 100, the two isolation implant regions 109C/109D of p-type are tied to the low negative voltage (−VPD). It should be understood that the resonant photodetector device 100 as used in conjunction with the receiver circuit can be used to suppress common-mode noise.

Figure 7:
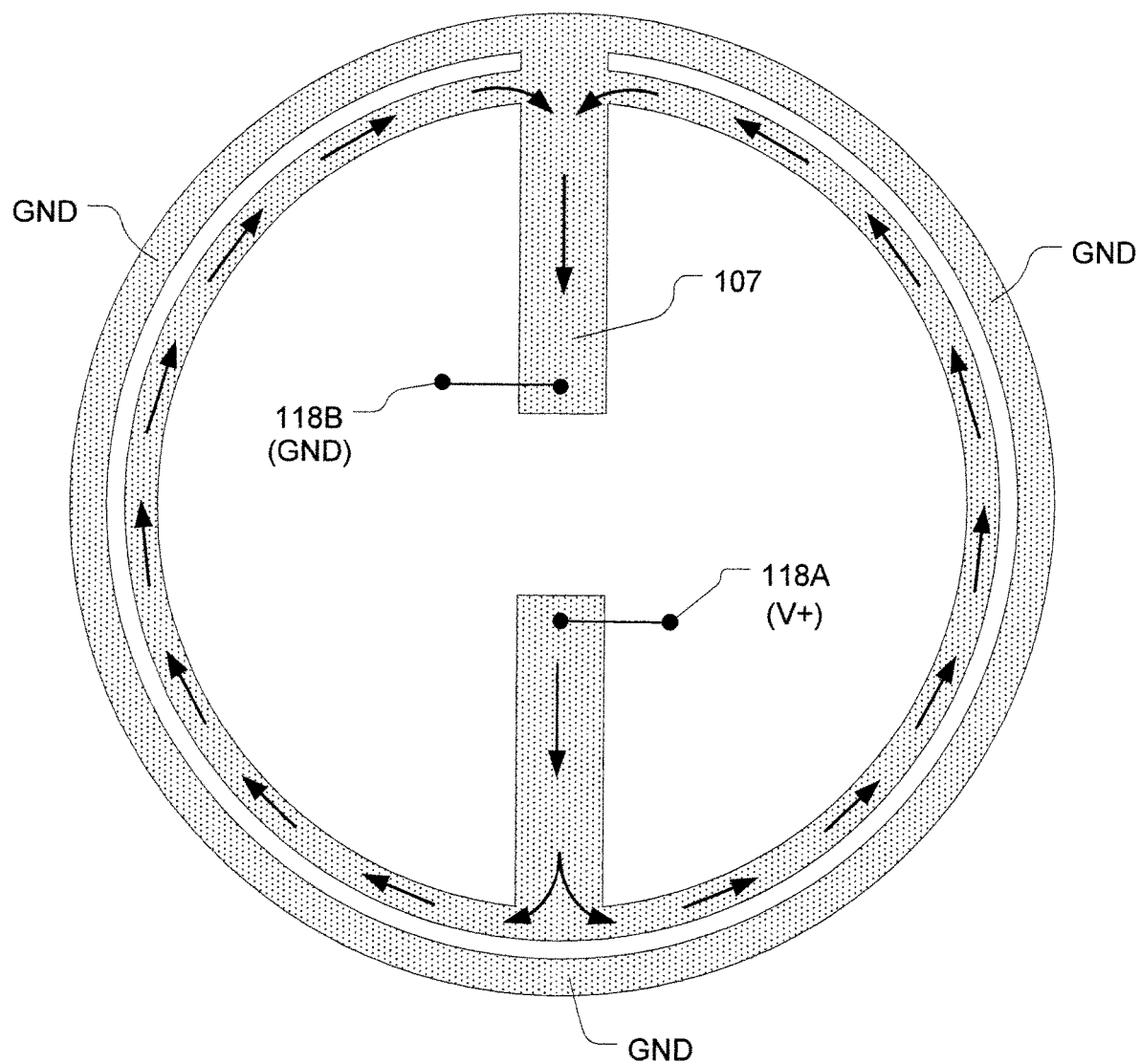
FIG. 7 shows an isolated view of the integrated thermal tuner, in accordance with some embodiments of the present invention.

FIG. 7 shows an isolated view of the integrated thermal tuner 107, in accordance with some embodiments of the present invention. The integrated thermal tuner 107 can be formed in the center of the passive optical cavity 103. In some embodiments, the integrated thermal tuner 107 can be formed as a resistive thermal control element in the form of a resistive heater. To avoid direct coupling of the thermal control driving signal into a photodetector input node, i.e., into a doped protuberance 105A/105B, the integrated thermal tuner 107 implements a self-shielding design, in which an outer shielding conductor that is tied to the direct current (DC) thermal control supply voltage completely encircles an inner driven conductor of the integrated thermal tuner 107. In some embodiments, thermal control is provided through the integrated thermal tuner 107 that includes a circular embedded heater driven single-endedly, i.e., with one node tied to a DC supply voltage and with the other node tied to the driving signal. In these embodiments, the outer shielding conductor is tied to the non-toggling node and completely encircles the inner driven conductor of the heater. The shielding voltage applied to the outer shielding conductor can be any DC signal, such as a reference ground potential (GND). In some embodiments, a single-endedly driven heater can use its own DC supply voltage for the shielding voltage that is applied to the outer shielding conductor.

For a thermal control element (heater device) of the integrated thermal tuner 107 which requires a high amount of current, electromigration of the metal traces and contacts to the element should be considered. In some embodiments, it may be desirable to drive the thermal control element using an alternating current (AC) signal, as opposed to single-endedly using a low-frequency or DC signal. Use of the AC signal to drive the thermal control element will enhance tolerance against electromigration. However, because an AC drive signal is no longer DC or low-frequency, use of the AC signal may exacerbate coupling of the thermal control drive signal into the receiver input, and necessitate the aforementioned shielded design, noting that the aforementioned shielded design may not be necessary with a single-ended drive.

In various embodiments, the resonant photodetector device 100 disclosed herein is a single resonant device that provides at least two output photocurrents. In various embodiments, the resonant photodetector device 100 disclosed herein provides a means to accurately implement a splitting ratio for photodetectors. In various embodiments, the resonant photodetector device 100 disclosed herein provides a means to combine an optical splitter and photodetectors in a single device. In various embodiments, the resonant photodetector device 100 disclosed herein provides a true fully-differential amplifier that can suppress common-mode noise. In various embodiments, the resonant photodetector device 100 disclosed herein provides a capability to build higher sensitivity optical signal receivers. In various embodiments, the resonant photodetector device 100 disclosed herein provides an ability to create pseudo-differential receivers with a single optical device. In various embodiments, the resonant photodetector device 100 disclosed herein provides a compact device that integrates the photodetection and the resonant thermal feedback control into one device. In various embodiments, the resonant photodetector device 100 disclosed herein provides balanced output photocurrents to simplify the electrical receiver design and their power-supply regulators. In various embodiments, the resonant photodetector device 100 disclosed herein provides balanced output photocurrents to improve the energy efficiency of the electrical receiver design. In various embodiments, the resonant photodetector device 100 disclosed herein provides improved parasitic capacitance on the receiver electrical node. In various embodiments, the resonant photodetector device 100 disclosed herein provides electrical isolation between output photocurrents. In various embodiments, the resonant photodetector device 100 disclosed herein provides devices suitable for wavelength division multiplexed communication systems. In various embodiments, the resonant photodetector device 100 disclosed herein provides reduced capacitive coupling between the receiver input nodes and the thermal feedback control. In various embodiments, the resonant photodetector device 100 disclosed herein provides spatially resolved light absorption throughout the resonator.

Given the foregoing, it should be understood that a photodetector device 100 is disclosed herein. The photodetector device 100 includes the optical cavity 103 having a circuitous configuration. The optical cavity 103 is configured to receive light coupled from the waveguide 101. The photodetector device 100 includes at least two photodetector sections 100A/100B formed over respective portions of the optical cavity 103. Each of the at least two photodetector sections 100A/100B is configured to detect light present within the optical cavity 103. Each of the at least two photodetector sections 100A/100B is configured for separate and independent control.

In some embodiments, each of the at least two photodetector sections 100A/100B is formed over the absorption region 113 formed in exposure to the optical cavity 103. The absorption region 113 is formed of a material that generates charge carriers upon absorption of light from within the optical cavity 103. In some embodiments, the absorption region 113 is formed of one or more of silicon-germanium, germanium, and polycrystalline silicon. In some embodiments, the absorption region 113 is segmented such that each of the at least two photodetector sections 100A/100B is formed over a physically separate portion of the absorption region 113A/113B.

In some embodiments, an inner wall of the optical cavity 103 includes the number of protuberances 105. In some embodiments, each of the at least two photodetector sections 100A/100B is formed over a portion of the optical cavity 103 that has at least three protuberances 105. In some embodiments, an implant region is formed within each protuberance 105 using either a first dopant type or a second dopant type to modify electrical characteristics of the protuberance 105 within the implant region. Adjacently positioned protuberances 105 associated with a given one of the at least two photodetector sections 100A/100B have their implant regions formed using different dopant types, e.g., protuberances 105A/105B.

In some embodiments, each of the at least two photodetector sections 100A/100B includes a first junction-forming implant region 111A/111B of the first dopant type and at least one of a second junction-forming implant region 109A/109B of the second dopant type. At least a portion of the first junction-forming implant region 111A/111B is formed over the absorption region 113. And, at least a portion of each second junction-forming implant region 109A/109B is formed over the absorption region 113 proximate to the first junction-forming implant region 111A/111B. The first junction-forming implant region 111A/111B extends over implant regions of every other protuberance 105, e.g., over protuberances 105B, formed using the first dopant type. Also, each second junction-forming implant region 109A/109B extends over the implant region of a corresponding one of the protuberances 105 formed using the second dopant type, e.g., over a corresponding one of the protuberances 105A. In some embodiments, the first dopant type is a p-type dopant and the second dopant type is an n-type dopant. In some embodiments, the first dopant type is an n-type dopant and the second dopant type is a p-type dopant.

In some embodiments, each of the at least two photodetector sections 100A/100B has its first junction-forming implant region 111A/111B of the first dopant type electrically connected to a corresponding first external contact 115A/115B. And, each of the at least two photodetector sections 100A/100B has its second junction-forming implant regions 109A/109B of the second dopant type collectively and electrically connected to a corresponding second external contact 120A/120B, such that each of the at least two photodetector sections 100A/100B is electrically connected to its own first external contact 115A/115B and its own second external contact 120A/120B. In some embodiments, the first external contact 115A/115B and the second external contact 120A/120B of a given photodetector section 100A/100B of the at least two photodetector sections is connected to receive a separate controlled bias voltage to establish a photocurrent between the first junction-forming implant region 111A/111B of the first dopant type corresponding to the given photodetector section 100A/100B and the second junction-forming regions 109A/109B of the second dopant type corresponding to the given photodetector section 100A/100B, where the photocurrent is formed by charge carriers generated within the absorption region 113.

In some embodiments, the photodetector device 100 includes the integrated thermal tuner 107 formed within an interior region circumscribed by the optical cavity 103. The integrated thermal tuner 107 is configured to control a temperature of the photodetector device 100. In some embodiments, the integrated thermal tuner 107 is connected to at least two external contacts 118A, 118B to enable controlled transmission of electrical current through the integrated thermal tuner 107. In some embodiments, the integrated thermal tuner 107 is configured as a resistive heater. In some embodiments, the integrated thermal tuner 107 is formed of a polycrystalline silicon material. In some embodiments, the integrated thermal tuner 107 is configured to maintain the photodetector device 100 at a temperature that provides for resonant optical coupling between the optical cavity 103 and the waveguide 101.

In some embodiments, the photodetector device 100 includes an optical power monitoring photodetector section formed over a portion of the optical cavity 103. The optical power monitoring photodetector section is configured for separate and independent control with respect to the at least two photodetector sections 100A/100B. The optical power monitoring photodetector section is formed over a portion of the absorption region 113. The optical power monitoring photodetector section includes three adjacent protuberances 105 of the number of protuberances 105. A center positioned one of the three adjacent protuberances 105 has an implant region formed using the second dopant type, e.g., so as to be a protuberance 105A. And, outer positioned ones of the three adjacent protuberances 105 have implant regions formed using the first dopant type, e.g., so as to be protuberances 105B.

The optical power monitoring photodetector section also includes a first junction-forming implant region of the first dopant type, e.g., a portion of 111A, and a second junction-forming implant region 109E of the second dopant type. Also, within the optical power monitoring photodetector section, at least a portion of the first junction-forming implant region (portion of 111A) is formed over the absorption region 113 and is interfaced with the implant regions of the outer positioned ones of the three adjacent protuberances 105, e.g., with the implant regions of protuberances 105B. Also, within the optical power monitoring photodetector section, at least a portion of the second junction-forming implant region 109E is formed over the absorption region 113 proximate to the first junction-forming implant region (portion of 111A) and is interfaced with the implant region of the center positioned one of the three adjacent protuberances 105, e.g., with the implant region of the protuberance 105A. In some embodiments, the optical power monitoring photodetector section includes a first external contact 121B electrically connected to the implant region of the center positioned one of the three adjacent protuberances 105, e.g., with the implant region of the protuberance 105A. And, the optical power monitoring photodetector section includes a second external contact 115A electrically connected to implant regions of both of the outer positioned ones of the three adjacent protuberances 105, e.g., with the implant regions of protuberances 105B.

In some embodiments, the first external contact 121B and the second external contact 115A of the optical power monitoring photodetector section are connected to receive separate controlled bias voltages to establish a photocurrent between the first junction-forming implant region (portion of 111A) of the optical power monitoring photodetector section and the second junction-forming region 109E of the optical power monitoring photodetector section, where the photocurrent is formed by charge carriers generated within the absorption region 113.

Figure 8:
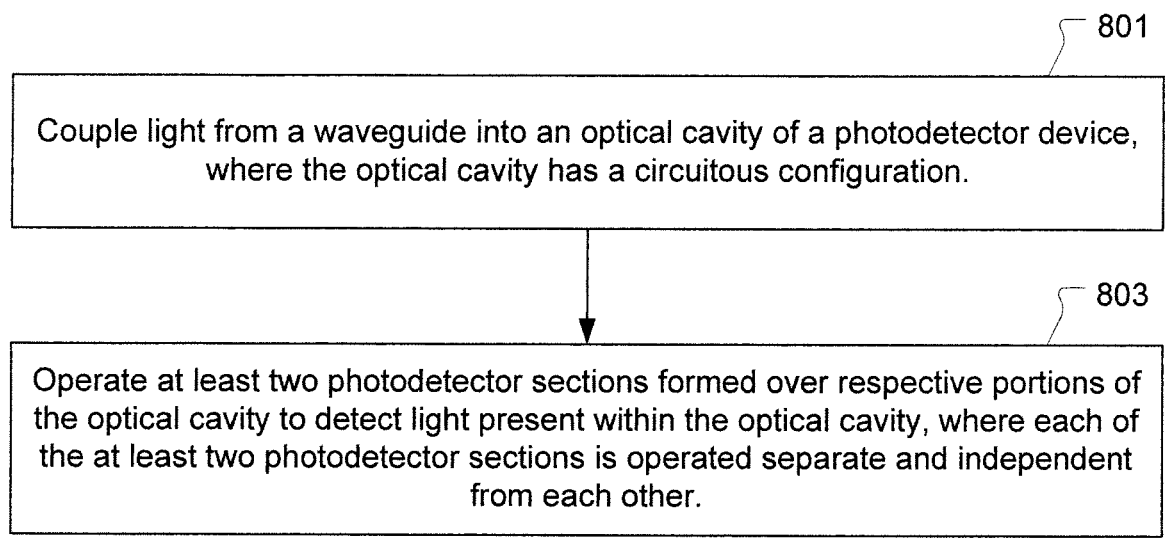
FIG. 8 shows a flowchart of a method for operating a photodetector device, in accordance with some embodiments of the present invention.

FIG. 8 shows a flowchart of a method for operating a photodetector device (100), in accordance with some embodiments of the present invention. The method includes an operation 801 for coupling light from a waveguide (101) into an optical cavity (103) of the photodetector device (100), where the optical cavity (103) has a circuitous configuration. The method also includes an operation 803 for operating at least two photodetector sections (100A/100B) formed over respective portions of the optical cavity (103) to detect light present within the optical cavity (103). Each of the at least two photodetector sections (100A/100B) is operated separate and independent from each other.

Figure 9:
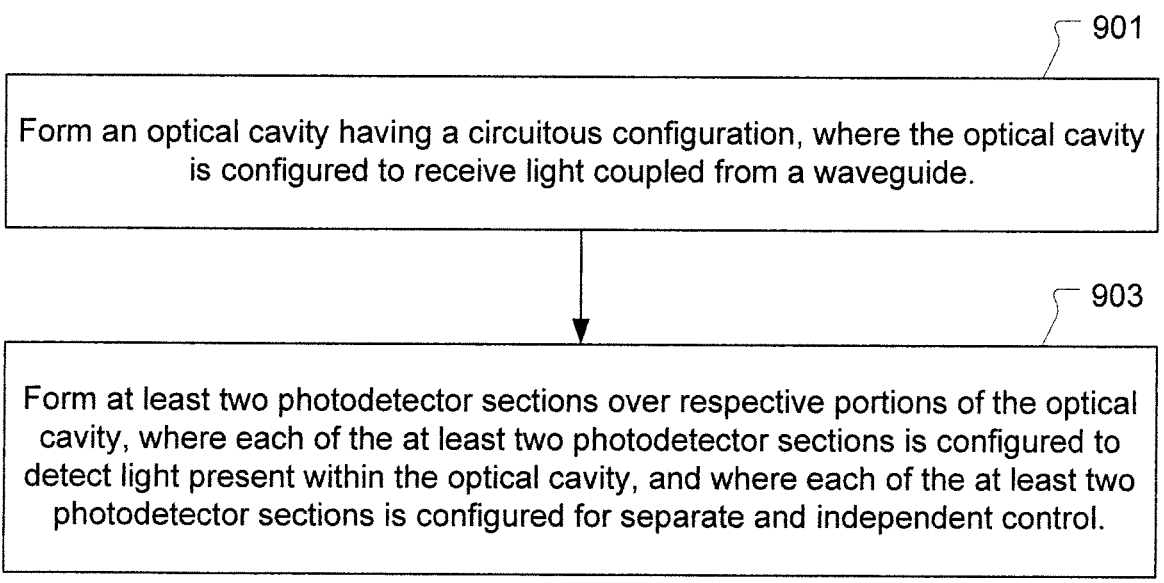
FIG. 9 shows a flowchart of a method for operating a photodetector device, in accordance with some embodiments of the present invention.

FIG. 9 shows a flowchart of a method for operating a photodetector device (100), in accordance with some embodiments of the present invention. The method includes an operation 901 for forming an optical cavity (103) having a circuitous configuration. The optical cavity (103) is configured to receive light coupled from a waveguide (101). The method also includes an operation 903 for forming at least two photodetector sections (100A/100B) over respective portions of the optical cavity (103). Each of the at least two photodetector sections (100A/100B) is configured to detect light present within the optical cavity (103). Each of the at least two photodetector sections (100A/100B) is configured for separate and independent control.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A photodetector device, comprising:
an optical cavity having a circuitous configuration, the optical cavity configured to receive light coupled from a waveguide; and
at least two photodetector sections formed over respective portions of the optical cavity, each of the at least two photodetector sections configured to detect light present within the optical cavity, each of the at least two photodetector sections configured for separate and independent control, wherein each of the at least two photodetector sections is formed over an absorption region formed in exposure to the optical cavity, the absorption region formed of a material that generates charge carriers upon absorption of light from within the optical cavity, and wherein the absorption region is segmented such that the at least two photodetector sections have at least two different lengths such that a respective amount of photocurrent produced by one or more of the at least two photodetector sections is larger than a respective amount of photocurrent produced by others of the at least two photodetector sections.

2. The photodetector device as recited in claim 1, wherein the absorption region is formed of one or more of silicon-germanium, germanium, and polycrystalline silicon.

3. The photodetector device as recited in claim 1, wherein the absorption region is segmented such that each of the at least two photodetector sections is formed over a physically separate portion of the absorption region.

4. The photodetector device as recited in claim 1, wherein an inner wall of the optical cavity includes a number of protuberances, wherein each of the at least two photodetector sections is formed over a portion of the optical cavity that has at least three protuberances.

5. The photodetector device as recited in claim 4, wherein an implant region is formed within each protuberance using either a first dopant type or a second dopant type to modify electrical characteristics of the protuberance within the implant region, and wherein adjacently positioned protuberances associated with a given one of the at least two photodetector sections have their implant regions formed using different dopant types.

6. The photodetector device as recited in claim 5, wherein each of the at least two photodetector sections includes a first junction-forming implant region of the first dopant type and at least one of a second junction-forming implant region of the second dopant type, at least a portion of the first junction-forming implant region formed over the absorption region, at least a portion of each second junction-forming implant region formed over the absorption region proximate to the first junction-forming implant region, the first junction-forming implant region extending over implant regions of every other protuberance formed using the first dopant type, each second junction-forming implant region extending over the implant region of a corresponding one of the protuberances formed using the second dopant type.

7. The photodetector device as recited in claim 6, wherein the first dopant type is a p-type dopant and the second dopant type is an n-type dopant, or wherein the first dopant type is an n-type dopant and the second dopant type is a p-type dopant.

8. The photodetector device as recited in claim 6, wherein each of the at least two photodetector sections has its first junction-forming implant region of the first dopant type electrically connected to a corresponding first external contact, and wherein each of the at least two photodetector sections has its second junction-forming implant regions of the second dopant type collectively and electrically connected to a corresponding second external contact, such that each of the at least two photodetector sections is electrically connected to its own first external contact and its own second external contact.

9. The photodetector device as recited in claim 8, wherein the first external contact and the second external contact of a given photodetector section of the at least two photodetector sections is connected to receive a separate controlled bias voltage to establish a photocurrent between the first junction-forming implant region of the first dopant type corresponding to the given photodetector section and the second junction-forming regions of the second dopant type corresponding to the given photodetector section, the photocurrent formed by charge carriers generated within the absorption region.

10. The photodetector device as recited in claim 9, further comprising:
an integrated thermal tuner formed within an interior region circumscribed by the optical cavity, wherein the integrated thermal tuner is configured to control a temperature of the photodetector device.

11. The photodetector device as recited in claim 10, wherein the integrated thermal tuner is connected to at least two external contacts to enable controlled transmission of electrical current through the integrated thermal tuner.

12. The photodetector device as recited in claim 11, wherein the integrated thermal tuner is configured as a resistive heater.

13. The photodetector device as recited in claim 11, wherein the integrated thermal tuner is formed of a polycrystalline silicon material.

14. The photodetector device as recited in claim 11, wherein the integrated thermal tuner is configured to maintain the photodetector device at a temperature that provides for resonant optical coupling between the optical cavity and the waveguide.

15. The photodetector device as recited in claim 9, further comprising:
an optical power monitoring photodetector section formed over a portion of the optical cavity, the optical power monitoring photodetector section configured for separate and independent control with respect to the at least two photodetector sections.

16. The photodetector device as recited in claim 15, wherein the optical power monitoring photodetector section is formed over a portion of the absorption region, wherein the optical power monitoring photodetector section includes three adjacent protuberances of the number of protuberances, wherein a center positioned one of the three adjacent protuberances has an implant region formed using the second dopant type, and wherein outer positioned ones of the three adjacent protuberances have implant regions formed using the first dopant type,
wherein the optical power monitoring photodetector section includes a first junction-forming implant region of the first dopant type and a second junction-forming implant region of the second dopant type, wherein the optical power monitoring photodetector section includes at least a portion of the first junction-forming implant region formed over the absorption region and interfaced with the implant regions of the outer positioned ones of the three adjacent protuberances, wherein the optical power monitoring photodetector section includes at least a portion of the second junction-forming implant region formed over the absorption region proximate to the first junction-forming implant region and interfaced with the implant region of the center positioned one of the three adjacent protuberances,
wherein the optical power monitoring photodetector section includes a first external contact electrically connected to the implant region of the center positioned one of the three adjacent protuberances, and wherein the optical power monitoring photodetector section includes a second external contact electrically connected to implant regions of both of the outer positioned ones of the three adjacent protuberances.

17. The photodetector device as recited in claim 16, wherein the first external contact and the second external contact of the optical power monitoring photodetector section are connected to receive separate controlled bias voltages to establish a photocurrent between the first junction-forming implant region of the optical power monitoring photodetector section and the second junction-forming region of the optical power monitoring photodetector section, the photocurrent formed by charge carriers generated within the absorption region.

18. A method for operating a photodetector device, comprising:
coupling light from a waveguide into an optical cavity of the photodetector device, the optical cavity having a circuitous configuration; and
operating at least two photodetector sections formed over respective portions of the optical cavity to detect light present within the optical cavity, each of the at least two photodetector sections operated separate and independent from each other, wherein each of the at least two photodetector sections is formed over an absorption region formed in exposure to the optical cavity, the absorption region formed of a material that generates charge carriers upon absorption of light from within the optical cavity, and wherein the absorption region is segmented such that the at least two photodetector sections have at least two different lengths such that a respective amount of photocurrent produced by one or more of the at least two photodetector sections is larger than a respective amount of photocurrent produced by others of the at least two photodetector sections.

19. The method as recited in claim 18, wherein an inner wall of the optical cavity includes a number of protuberances, wherein each of the at least two photodetector sections is formed over a portion of the optical cavity that has at least three protuberances, wherein an implant region is formed within each protuberance using either a first dopant type or a second dopant type to modify electrical characteristics of the protuberance within the implant region, and wherein adjacently positioned protuberances associated with a given one of the at least two photodetector sections have their implant regions formed using different dopant types.

20. The method as recited in claim 19, wherein each of the at least two photodetector sections includes a first junction-forming implant region of the first dopant type and at least one of a second junction-forming implant region of the second dopant type, at least a portion of the first junction-forming implant region formed over the absorption region, at least a portion of each second junction-forming implant region formed over the absorption region proximate to the first junction-forming implant region, the first junction-forming implant region extending over implant regions of every other protuberance formed using the first dopant type, each second junction-forming implant region extending over the implant region of a corresponding one of the protuberances formed using the second dopant type.

21. The method as recited in claim 20, wherein each of the at least two photodetector sections has its first junction-forming implant region of the first dopant type electrically connected to a corresponding first external contact, and wherein each of the at least two photodetector sections has its second junction-forming implant regions of the second dopant type collectively and electrically connected to a corresponding second external contact, such that each of the at least two photodetector sections is electrically connected to its own first external contact and its own second external contact.

22. The method as recited in claim 21, further comprising:
receiving a first controlled bias voltage at the first external contact of a given photodetector section of the at least two photodetector sections; and
receiving a second controlled bias voltage at the second external contact of the given photodetector section, wherein the first controlled bias voltage and the second controlled bias voltage establish a photocurrent between the first junction-forming implant region of the first dopant type corresponding to the given photodetector section and the second junction-forming regions of the second dopant type corresponding to the given photodetector section, the photocurrent formed by charge carriers generated within the absorption region.

23. The method as recited in claim 18, further comprising:
controlling a temperature of the photodetector device using an integrated thermal tuner formed within an interior region circumscribed by the optical cavity.

24. The method as recited in claim 18, further comprising:
monitoring optical power within the optical cavity using an optical power monitoring photodetector section formed over a portion of the optical cavity, the optical power monitoring photodetector section configured for separate and independent control with respect to the at least two photodetector sections.

25. A method for manufacturing a photodetector device, comprising:
forming an optical cavity having a circuitous configuration, the optical cavity configured to receive light coupled from a waveguide; and
forming at least two photodetector sections over respective portions of the optical cavity, each of the at least two photodetector sections configured to detect light present within the optical cavity, each of the at least two photodetector sections configured for separate and independent control, wherein each of the at least two photodetector sections is formed over an absorption region formed in exposure to the optical cavity, the absorption region formed of a material that generates charge carriers upon absorption of light from within the optical cavity, and wherein the absorption region is segmented such that the at least two photodetector sections have at least two different lengths such that a respective amount of photocurrent produced by one or more of the at least two photodetector sections is larger than a respective amount of photocurrent produced by others of the at least two photodetector sections.

26. The method as recited in claim 25, wherein the absorption region is formed of one or more of silicon-germanium, germanium, and polycrystalline silicon.

27. The method as recited in claim 25, wherein the absorption region is segmented such that each of the at least two photodetector sections is formed over a physically separate portion of the absorption region.

28. The method as recited in claim 25, further comprising:
forming a number of protuberances on an inner wall of the optical cavity, wherein each of the at least two photodetector sections is formed over a portion of the optical cavity that has at least three protuberances; and
forming an implant region within each protuberance using either a first dopant type or a second dopant type to modify electrical characteristics of the protuberance within the implant region, wherein adjacently positioned protuberances associated with a given one of the at least two photodetector sections have their implant regions formed using different dopant types.

29. The method as recited in claim 28, further comprising:
forming a first junction-forming implant region of the first dopant type within each of the at least two photodetector sections, wherein at least a portion of the first junction-forming implant region is formed over the absorption region, wherein the first junction-forming implant region is formed to extend over implant regions of every other protuberance formed using the first dopant type; and
forming at least one of a second junction-forming implant region of the second dopant type within each of the at least two photodetector sections, wherein at least a portion of each second junction-forming implant region is formed over the absorption region proximate to the first junction-forming implant region, wherein each second junction-forming implant region is formed to extend over the implant region of a corresponding one of the protuberances formed using the second dopant type.

30. The method as recited in claim 29, further comprising:
electrically connecting the first junction-forming implant region of the first dopant type of each of the at least two photodetector sections to a corresponding first external contact, wherein each of the at least two photodetector sections is electrically connected to its own first external contact; and electrically connecting the second junction-forming implant regions of the second dopant type of each of the at least two photodetector sections to a corresponding second external contact, wherein each of the at least two photodetector sections is electrically connected to its own second external contact.

31. The method as recited in claim 30, further comprising:
connecting the first external contact of a given photodetector section of the at least two photodetector sections to receive a first controlled bias voltage; and
connecting the second external contact of the given photodetector section to receive a second controlled bias voltage,
wherein the first and second controlled bias voltages establish a photocurrent between the first junction-forming implant region of the first dopant type corresponding to the given photodetector section and the second junction-forming regions of the second dopant type corresponding to the given photodetector section, wherein the photocurrent is formed by charge carriers generated within the absorption region.

32. The method as recited in claim 25, further comprising:
forming an integrated thermal tuner within an interior region circumscribed by the optical cavity, wherein the integrated thermal tuner is configured to control a temperature of the photodetector device.

33. The method as recited in claim 25, further comprising:
forming an optical power monitoring photodetector section over a portion of the optical cavity, the optical power monitoring photodetector section configured for separate and independent control with respect to the at least two photodetector sections.

\* \* \* \* \*